United States Patent
Horiuchi et al.

(10) Patent No.: US 7,372,882 B2
(45) Date of Patent: May 13, 2008

(54) DRIVING CIRCUIT FOR AND SEMICONDUCTOR DEVICE FOR DRIVING LASER DIODE

(75) Inventors: Tsuyoshi Horiuchi, Tokyo (JP); Takehiko Umeyama, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 334 days.

(21) Appl. No.: 11/115,133

(22) Filed: Apr. 27, 2005

(65) Prior Publication Data

US 2005/0243879 A1    Nov. 3, 2005

(30) Foreign Application Priority Data

Apr. 28, 2004 (JP) .............................. 2004-133747
Jun. 17, 2004 (JP) .............................. 2004-179625
Mar. 4, 2005 (JP) .............................. 2005-061079

(51) Int. Cl.
*H01S 3/00* (2006.01)

(52) U.S. Cl. ................. 372/38.02; 372/38.03; 372/38.07

(58) Field of Classification Search ............. 372/38.02, 372/38.1, 38.03, 38.07, 38.08
See application file for complete search history.

(56) References Cited

U.S. PATENT DOCUMENTS

2005/0069002 A1* 3/2005 Senga et al. ............. 372/38.01
2005/0123013 A1* 6/2005 Nishimura ............... 372/38.03

FOREIGN PATENT DOCUMENTS

| JP | 3-235385 | 10/1991 |
| JP | 5-218542 | 8/1993 |
| JP | 2000-208864 | 7/2000 |

\* cited by examiner

*Primary Examiner*—Armando Rodriguez
(74) *Attorney, Agent, or Firm*—Buchanan Ingersoll & Rooney PC

(57) ABSTRACT

A driving circuit supplies a suppression current (I4) which reduces a decrease in a driving current (Idrive) immediately after occurrence of an overshoot at the time of the rise of the driving current (Idrive) to a laser diode (1). The driving circuit draws a suppression current (I5) which reduces an increase in the driving current (Idrive) immediately after occurrence of an undershoot at the time of the fall of the driving current (Idrive) from the driving current (Idrive).

21 Claims, 18 Drawing Sheets t1 : TIME DECIDED BY Ia AND Ca
t1' : TIME DECIDED BY Ia' AND Ca'
t2 : TIME DECIDED BY Ib AND Cb
t2' : TIME DECIDED BY Ib' AND Cb'
t3 : TIME DECIDED BY Id AND Cd
t3' : TIME DECIDED BY Id' AND Cd'

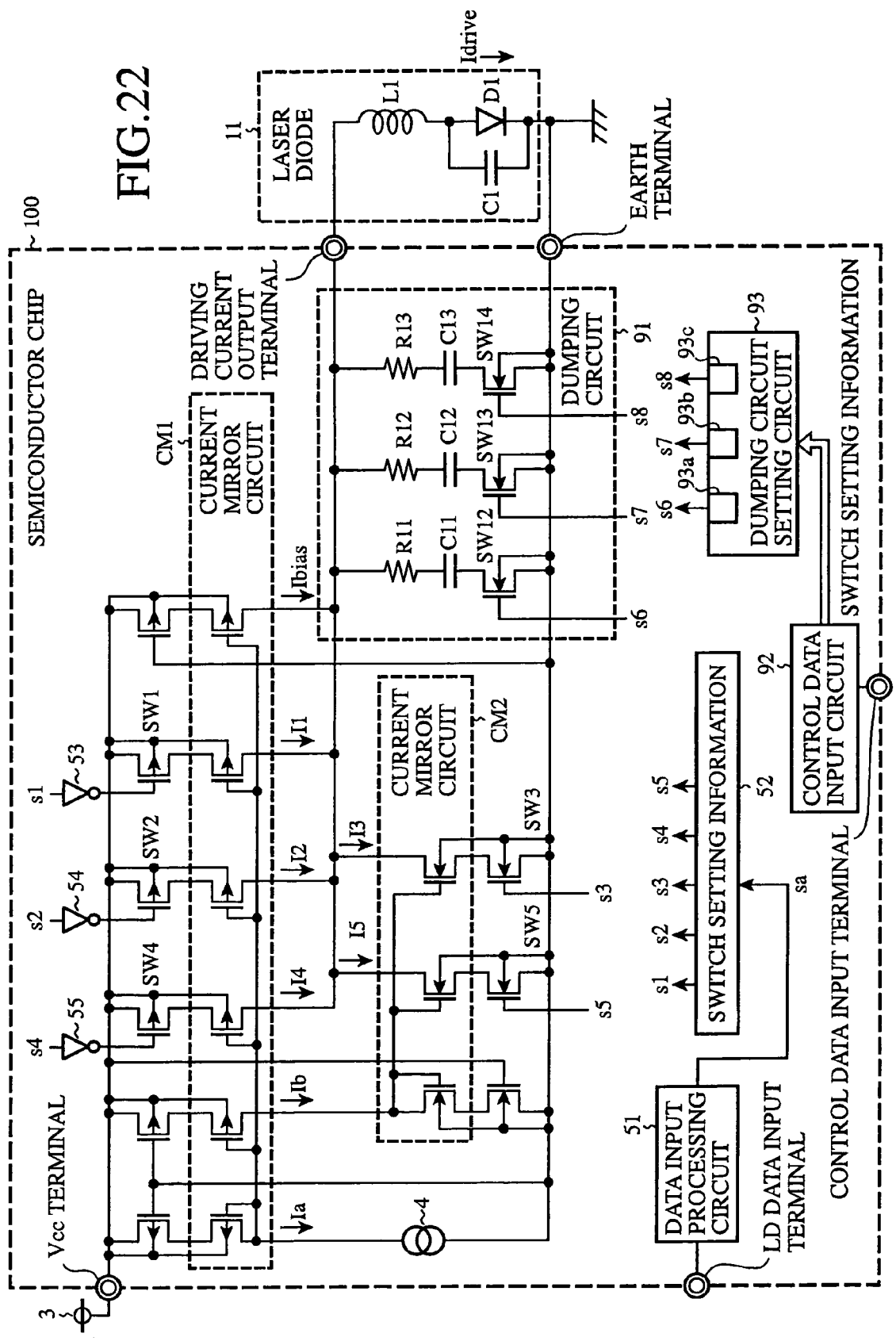

DRIVING CIRCUIT FOR AND SEMICONDUCTOR DEVICE FOR DRIVING LASER DIODE

BACKGROUND OF THE INVENTION

1. Field of the Invention

The present invention relates to a driving circuit for and a semiconductor device for driving a laser diode, which can switch between the on and off states of the laser diode at a high speed.

2. Description of Related Art

In addition to a driving current supply circuit for supplying a driving current to a laser diode when causing the laser diode to emit light, a related art driving circuit for driving the laser diode includes an auxiliary current supply circuit for, when the driving current rises, supplying an auxiliary current used for speeding up the rise of the driving current to the laser diode. The related art driving circuit further includes a current drawing circuit for drawing a current from the driving current when the driving current fails in order to speed up the fall of the driving current. Since the related art driving circuit thus has the auxiliary current supply circuit and the current drawing circuit, the related art driving circuit makes it possible to switch between the on and off states of the laser diode at a high speed.

In addition to the above-mentioned related art driving circuit, there has been provided a driving circuit for driving a laser diode, which controls the amplitude of a switching control wave so that the duty of the switching control wave becomes equal to 100% when a driving current supplied to the laser diode has a maximum amount, thereby reducing the power dissipation of a switching element, as disclosed by patent reference 1.

However, patent reference 1 discloses neither a technology for switching the on and off states of the laser diode at a high speed, nor technology for shaping the waveform of the driving current which is supplied to the laser diode.

[Patent reference 1] JP,5-218542,A (see paragraph numbers [0016] to [0024] and FIG. 3)

Although the former related art driving circuit that is so constructed as mentioned above can switch the on and off states of the laser diode at a high speed, a problem with the related art driving circuit is that since the driving current supplied to the laser diode decreases greatly immediately after the occurrence of an overshoot at the time of the rise of the driving current, whereas the driving current supplied to the laser diode increases greatly immediately after the occurrence of an undershoot at the time of the fall of the driving current, the driving current does not have a rectangular waveform and therefore a waveform shaping circuit for shaping the waveform of the driving current into a rectangular one is additionally needed.

SUMMARY OF THE INVENTION

The present invention is made in order to solve the above-mentioned problem, and it is therefore an object of the present invention to provide a driving circuit for and a semiconductor device for driving a laser diode, which can bring the waveform of a driving current which is supplied to the laser diode close to a rectangular one without additionally disposing any waveform shaping circuit.

In accordance with the present invention, there is provided a driving circuit for driving a laser diode, the driving circuit including a suppression current supply circuit for supplying a suppression current for reducing a decrease in a driving current supplied from a driving current supply circuit, which occurs after occurrence of an overshoot at the time of the rise of the driving current, to the laser diode.

The driving circuit in accordance with the present invention is so constructed as to supply the suppression current for reducing the decrease in the driving current supplied from the driving current supply circuit, which occurs after the occurrence of an overshoot at the time of the rise of the driving current, to the laser diode. Therefore, the present invention offers an advantage of being able to bring the waveform of the driving current at the time of the rise of the driving current close to a rectangular one without disposing any waveform shaping circuit.

Further objects and advantages of the present invention will be apparent from the following description of the preferred embodiments of the invention as illustrated in the accompanying drawings.

BRIEF DESCRIPTION OF THE DRAWINGS

FIG. 22 is a detailed circuit diagram showing a driving circuit for driving a laser diode in accordance with embodiment 10 of the present invention.

DETAILED DESCRIPTION OF THE PREFERRED EMBODIMENTS

Embodiment 1

Figure 1:
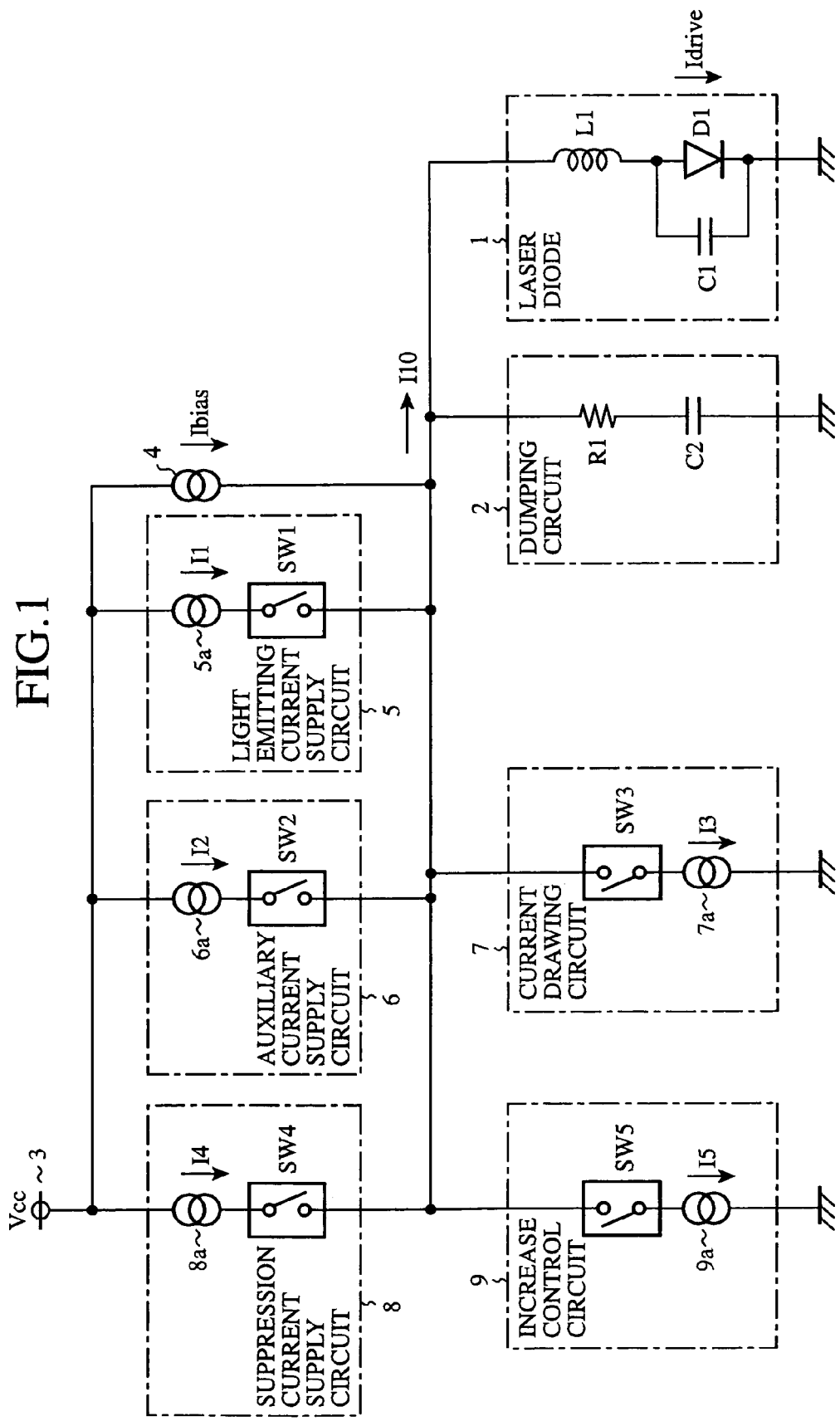
FIG. 1 is a block diagram showing a driving circuit for driving a laser diode in accordance with embodiment 1 of the present invention.

FIG. 1 is a block diagram showing a driving circuit for driving a laser diode in accordance with embodiment 1 of the present invention. In the figure, the laser diode 1 emits light when receiving supply of a driving current Idrive, and the laser diode 1 is provided with a diode D1 having a cathode which is grounded, a capacitor C1 connected in parallel to the diode D1, and an inductor L1 connected to the anode of the diode D1.

A dumping circuit 2 is connected in parallel to the laser diode 1 in order to reduce an overshoot and an undershoot which appear respectively when the driving current Idrive which is supplied to the laser diode 1 rises and falls. The dumping circuit 2 is provided with a resistance element R1 and a capacitor C2.

A current source 4 generates a bias current Ibias in response to a supply of a voltage Vcc from a power supply 3, and constantly supplies the bias current Ibias to the laser diode 1. The laser diode 1 does not emit light when the amount of the driving current Idrive supplied to the laser diode 1 is equal to or lower than that of the bias current Ibias, while the laser diode 1 emits light when the amount of the driving current Idrive exceeds that of the bias current Ibias. In other words, the bias current Ibias is supplied to the laser diode 1 as a threshold current. A light emitting current supply circuit 5 is provided with a current source 5a and a switch SW1. The current source 5a generates a light emitting current I1 in response to a supply of the voltage Vcc from the power supply 3, and the switch SW1 switches on and supplies the light emitting current I1 generated by the current source 5a to the laser diode 1 when causing the laser diode 1 to emit light. A driving current supply circuit is comprised of the light emitting current supply circuit 5 and the current source 4.

An auxiliary current supply circuit 6 is provided with a current source 6a and a switch SW2. The current source 6a generates a boost current I2, as an auxiliary current, for speeding up the rise (equivalent to the rise of the driving current Idrive supplied to the laser diode 1) of the light emitting current I1 supplied from the light emitting current supply circuit 5 in response to a supply of the voltage Vcc from the power supply 3. The switch SW2 switches on at the time of the rise of the light emitting current I1, and then supplies the boost current I2 generated by the current source 6a to the laser diode 1.

A current drawing circuit 7 is provided with a current source 7a and a switch SW3. The current source 7a generates a drawn current I3 for speeding up the fall (equivalent to the fall of the driving current Idrive supplied to the laser diode 1) of the light emitting current I1 supplied from the light emitting current supply circuit 5 in response to a supply of the voltage Vcc from the power supply 3. The switch SW3 switches on at the time of the fall of the light emitting current I1, and then draws the drawn current I3 generated by the current source 7a from the light emitting current I1 so as to send the drawn current I3 to a ground.

A suppression current supply circuit 8 is provided with a current source 8a and a switch SW4. The current source 8a receives a supply of the voltage Vcc from the power supply 3, and generates a suppression current I4 which reduces a decrease in the light emitting current I1 which occurs immediately after the occurrence of an overshoot at the time of the rise of the light emitting current I1 supplied from the light emitting current supply circuit 5 (corresponding to the time of the rise of the driving current Idrive supplied to the laser diode 1). The switch SW4 switches on immediately after the occurrence of the overshoot, and then supplies the suppression current I4 generated by the current source 8a to the laser diode 1.

An increase control circuit 9 is provided with a current source 9a and a switch SW5. The current source 9a receives a supply of the voltage Vcc from the power supply 3, and generates a suppression current I5 which reduces an increase in the light emitting current I1 which occurs immediately after the occurrence of an undershoot at the time of the fall of the light emitting current I1 supplied from the light emitting current supply circuit 5 (corresponding to the time of the fall of the driving current Idrive supplied to the laser diode 1). The switch SW5 is switched on immediately after the occurrence of the undershoot, and draws the suppression current I5 generated by the current source 9a from the light emitting current I1 so as to send the suppression current I5 to the ground.

Figure 3:
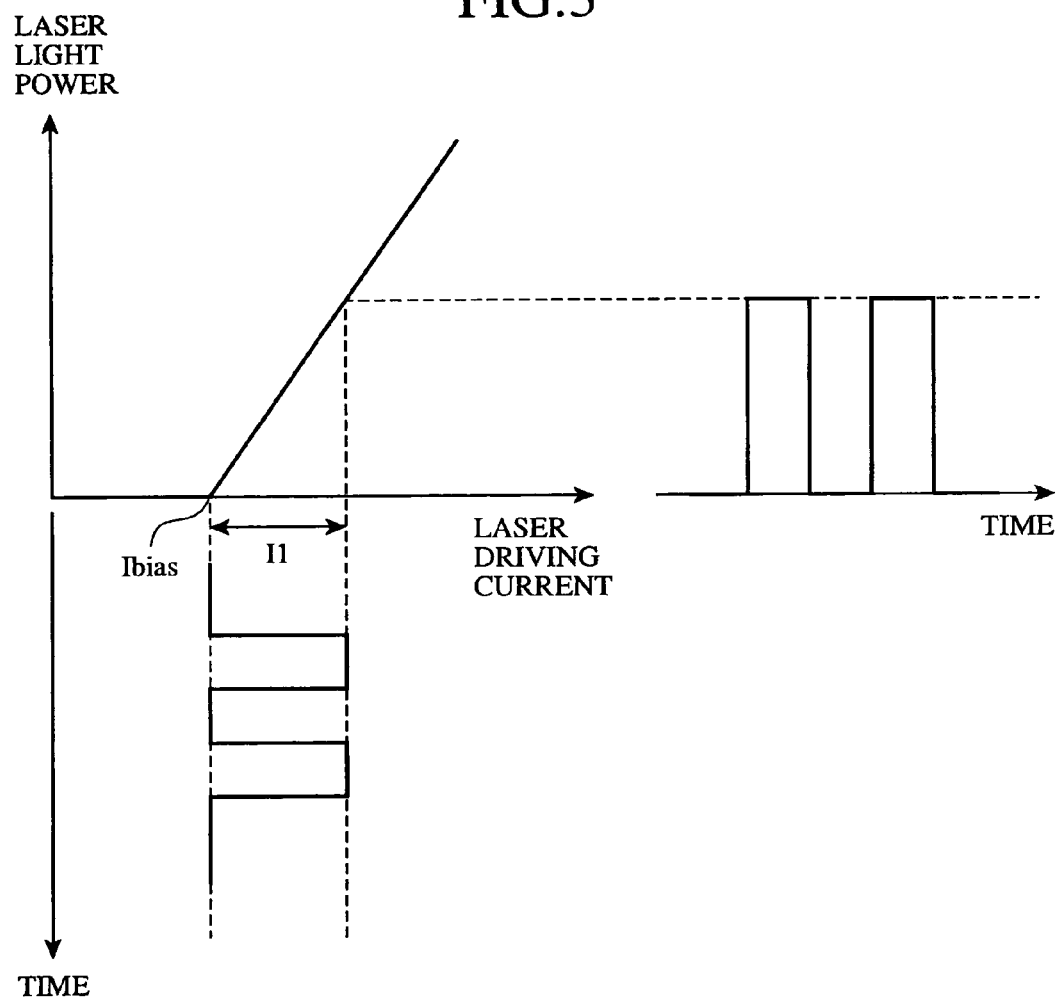
FIG. 3 is an explanatory diagram showing the light emitting characteristics of the laser diode.

Next, the operation of the driving circuit in accordance with this embodiment of the present invention will be explained. The current source 4 generates a bias current Ibias in response to the supply of the voltage Vcc from the power supply 3, and constantly supplies the bias current Ibias to the laser diode 1. The laser diode 1 does not emit light when the driving current Idrive is equal to or lower than the bias current Ibias, whereas the laser diode 1 emits light when the driving current Idrive exceeds the bias current Ibias, as shown in FIG. 3. Therefore, the emission of the laser diode 1 is controlled by constantly supplying the bias current Ibias to the laser diode 1 and controlling the supply of the light emitting current I1.

Figure 2:
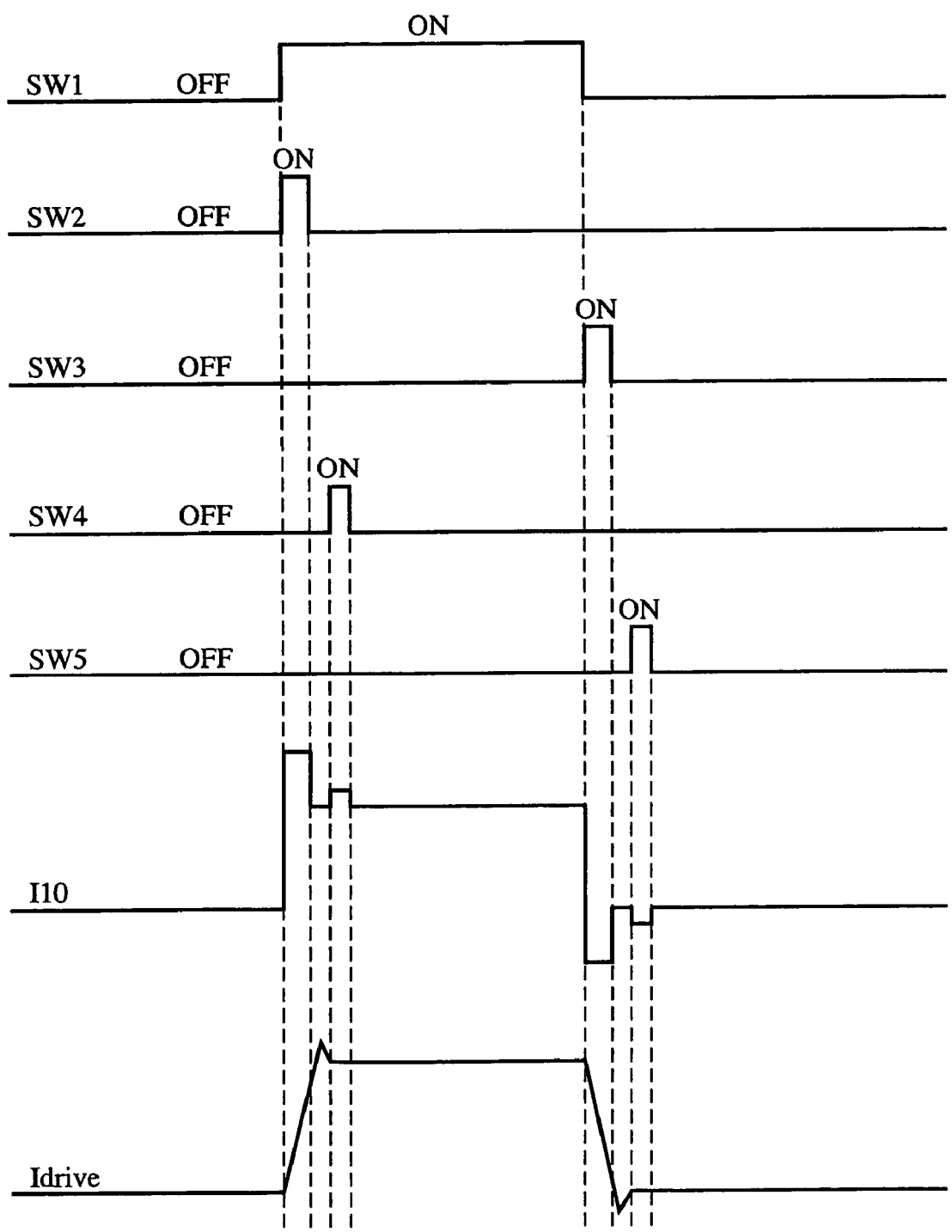
FIG. 2 is a diagram showing the waveforms of signals in a case where a suppression current supplying circuit and an increase control circuit are mounted in the driving circuit.

The current source 5a of the light emitting current supply circuit 5 generates a light emitting current I1 in response to the supply of the voltage Vcc from the power supply 3. When causing the laser diode 1 to emit light, the light emitting current supply circuit 5 switches on the switch SW1 and then supplies the light emitting current I1 generated by the current source 5a to the laser diode 1, as shown in FIG. 2.

As a result, while the driving current Idrive (=the light emitting current I1+the bias current Ibias) supplied to the laser diode 1 rises, the auxiliary current supply circuit 6 supplies a boost current I2 to the laser diode 1 in order to quickly switch the laser diode 1 from the off state to the on state. In other words, the current source 6a of the auxiliary current supply circuit 6 generates the boost current I2 for speeding up the rise of the driving current Idrive (=the light emitting current I1+the bias current Ibias) in response to the supply of the voltage Vcc from the power supply 3. The auxiliary current supply circuit 6 then switches on the switch SW2 at the same time when the switch SW1 of the light emitting current supply circuit 5 is switched on so as to supply the boost current I2 generated by the current source 6a to the laser diode 1, as shown in FIG. 2.

Figure 4:
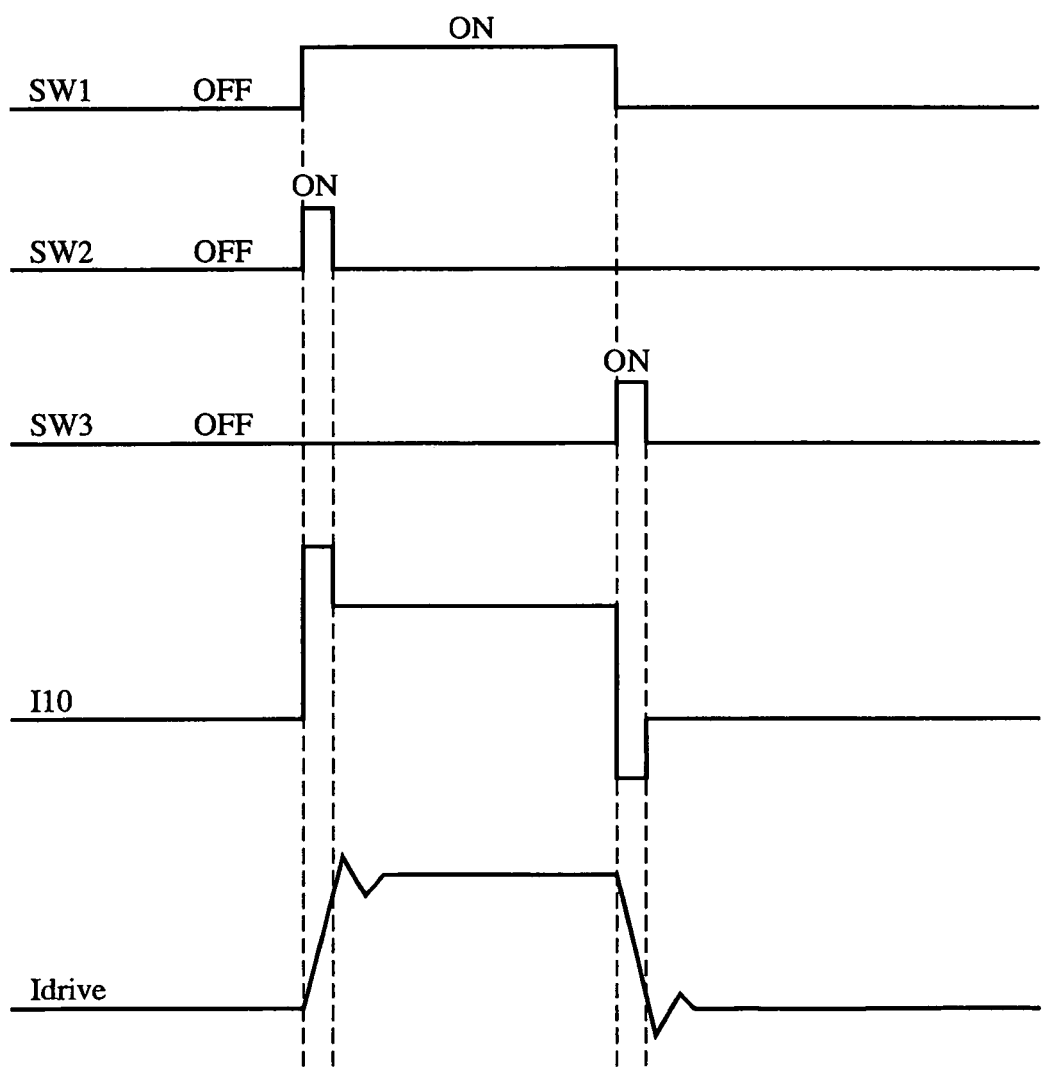
FIG. 4 is a diagram showing the waveforms of signals in a case where the suppression current supplying circuit and the increase control circuit are not mounted in the driving circuit.

As a result, although the driving current Idrive supplied to the laser diode 1 becomes (the light emitting current I1+the bias current Ibias+the boost current I2) and the rise of the driving current Idrive becomes steep, since the inductor L1 and the capacitor C1 are included in the laser diode 1, an overshoot occurs due to a resonance phenomenon caused by the inductor L1 and the capacitor C1 at the time of the rise of the driving current Idrive while the amount of the driving current Idrive decreases greatly immediately after the occurrence of the overshoot and the driving current Idrive does not have a rectangular waveform (refer to FIG. 4). FIG. 4 is a diagram showing the waveforms of signals in a case where the suppression current supply circuit 8 and the increase control circuit 9 are not disposed in the driving circuit.

The suppression current supply circuit 8 supplies a suppression current I4 to the laser diode 1 in order to reduce the decrease in the amount of the driving current Idrive which occurs immediately after the occurrence of the overshoot. In other words, the current source 8a of the suppression current supply circuit 8 receives the supply of the voltage Vcc from the power supply 3 and generates the suppression current I4 which reduces the decrease in the amount of the driving current Idrive (=the light emitting current I1+the bias current Ibias) which occurs immediately after the occurrence of the overshoot. The suppression current supply circuit 8 then switches on the switch SW4 immediately after the occurrence of the overshoot, and supplies the suppression current I4 generated by the current source 8a to the laser diode 1, as shown in FIG. 2.

Next, a case where the driving circuit switches the laser diode 1 from the on state to the off state will be explained. When switching off the laser diode 1, the light emitting current supply circuit 5 switches off the switch SW1 so as to stop the supply of the light emitting current I1 to the laser diode 1, as shown in FIG. 2.

As a result, while the driving current Idrive (=bias current Ibias) currently supplied to the laser diode 1 falls, the current drawing circuit 7 draws a current from the driving current Idrive in order to quickly switch the laser diode 1 from the on state to the off state. In other words, the current source 7a of the current drawing circuit receives the supply of the voltage Vcc from the power supply 3 and generates a drawn current I3 for speeding up the fall of the driving current Idrive (=the bias current Ibias). The current drawing circuit then switches on the switch SW3 at the same time when the switch SW1 of the light emitting current supply circuit 5 is switched off, and then draws the drawn current I3 generated by the current source 7a from the driving current Idrive (=the bias current Ibias) so as to send the drawn current I3 to the ground, as shown in FIG. 2.

As a result, although the driving current Idrive supplied to the laser diode 1 becomes (the bias current Ibias−the drawing current I3) and the fall of the driving current Idrive becomes steep, since the inductor L1 and the capacitor C1 are included in the laser diode 1, an undershoot occurs due to the resonance phenomenon caused by the inductor L1 and the capacitor C1 at the time of the fall of the driving current Idrive while the amount of the driving current Idrive increases largely immediately after the occurrence of the undershoot and the driving current Idrive does not have a rectangular waveform (refer to FIG. 4). FIG. 4 is a diagram showing the waveforms of signals in a case where the suppression current supply circuit 8 and the increase control circuit 9 are not disposed in the driving circuit.

The increase control circuit 9 draws a current from the driving current Idrive in order to reduce the increase in the driving current Idrive which occurs immediately after the occurrence of the undershoot. In other words, the current source 9a of the increase control circuit 9 receives the supply of the voltage Vcc from the power supply 3 and generates a suppression current I5 which reduces the increase in the amount of the driving current Idrive (=the bias current Ibias) which occurs immediately after the occurrence of the undershoot. The increase control circuit 9 switches on the switch SW5 immediately after the occurrence of the undershoot, and draws the suppression current I5 generated by the current source 9a from the driving current Idrive (=the bias current Ibias) so as to send the suppression current I5 to the ground, as shown in FIG. 2.

Figure 5:
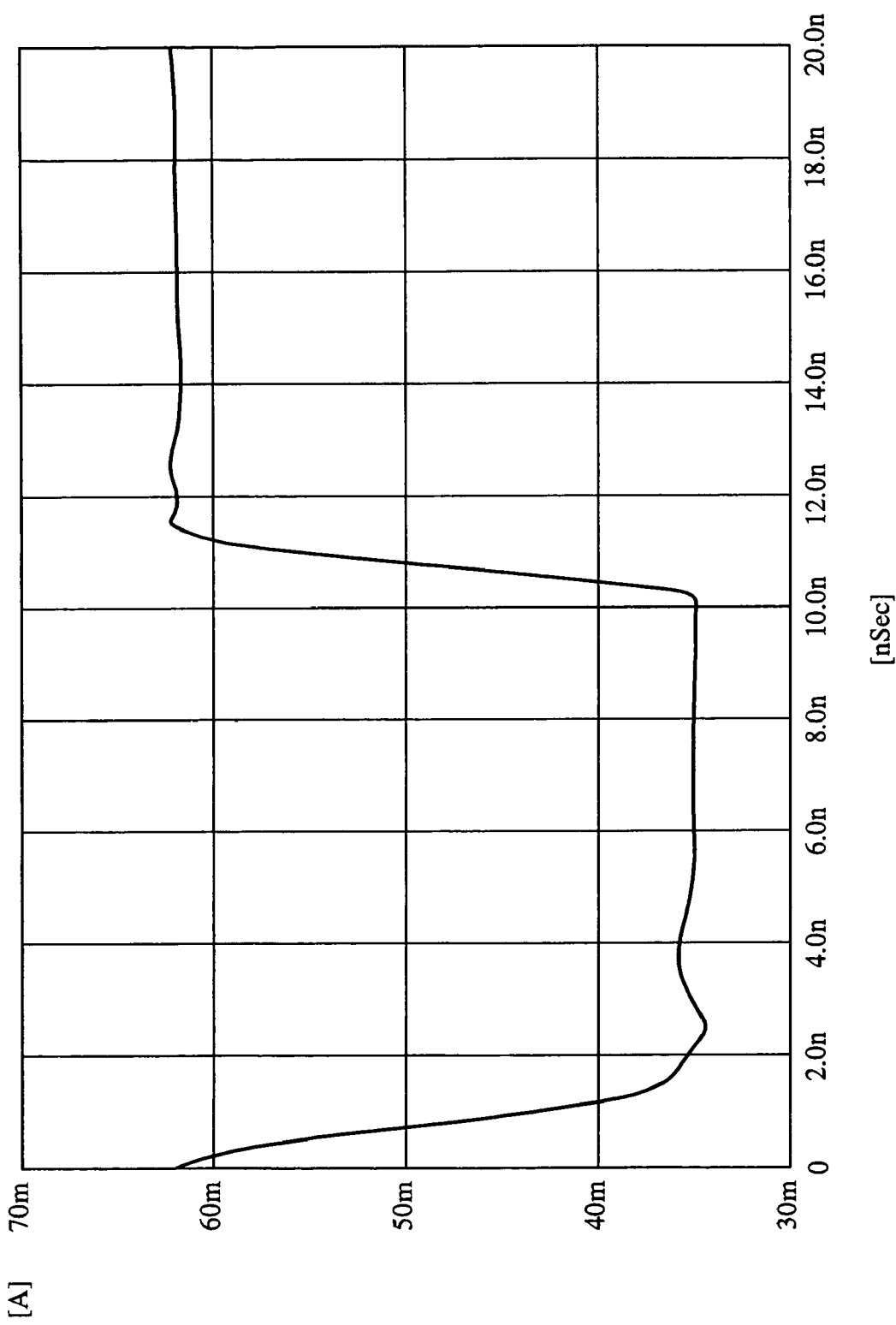
FIG. 5 is a diagram showing the waveform of a driving current Idrive in the case the suppression current supplying circuit and the increase control circuit are mounted in the driving circuit.
Figure 6:
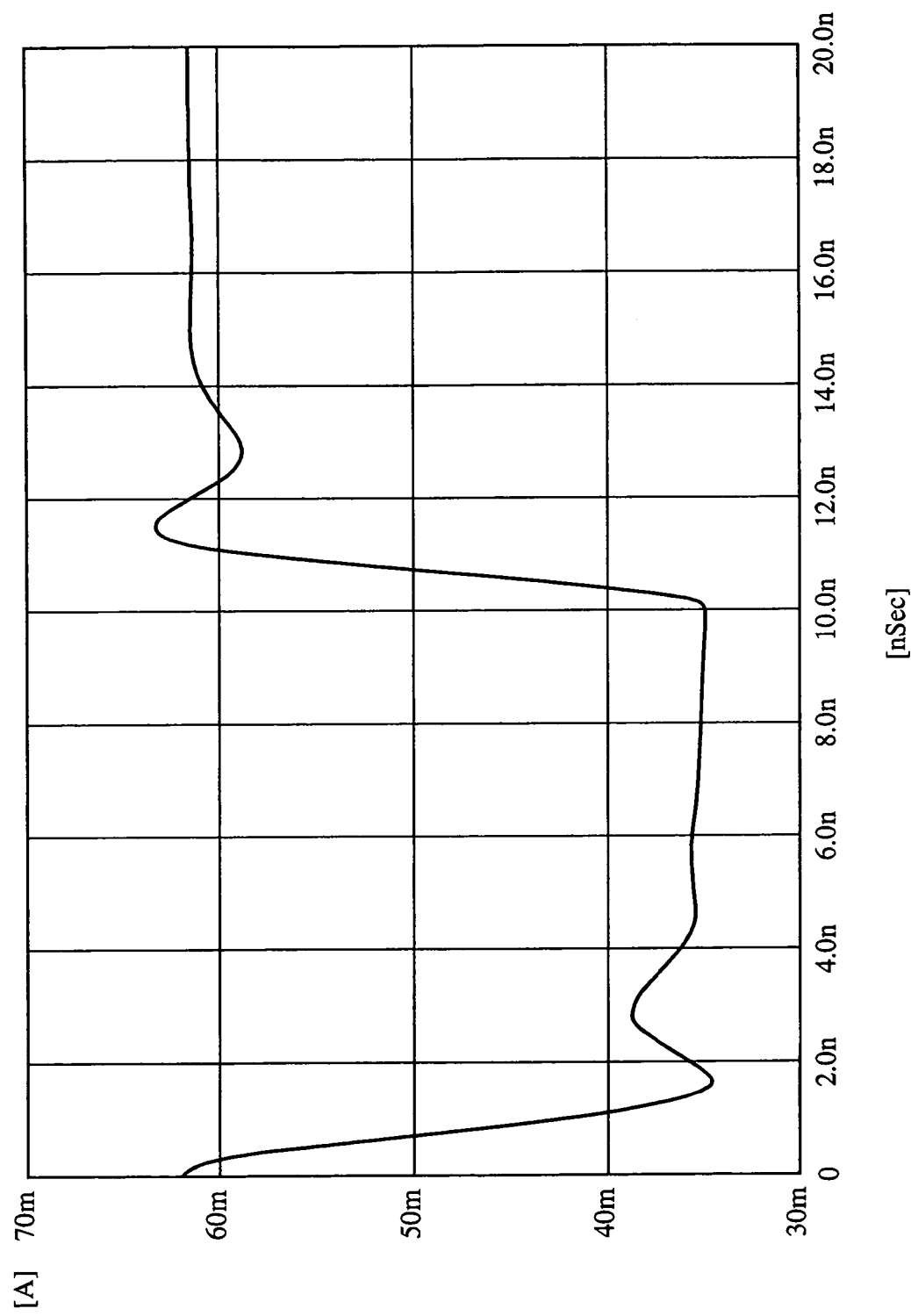
FIG. 6 is a diagram showing the waveform of the driving current Idrive in the case the suppression current supplying circuit and the increase control circuit are not mounted in the driving circuit.

FIG. 5 is a diagram showing the waveform of the driving current Idrive in a case where the suppression current supply circuit 8 and the increase control circuit 9 are disposed in the driving circuit, and FIG. 6 is a diagram showing the waveform of the driving current Idrive in a case where the suppression current supply circuit 8 and the increase control circuit 9 are not disposed in the driving circuit.

As can be seen from the above description, in accordance with this embodiment 1, the driving circuit is so constructed as to supply the suppression current I4, which reduces the decrease in the driving current Idrive which occurs immediately after the occurrence of an overshoot at the time of the rise of the driving current Idrive, to the laser diode 1. Therefore, the present embodiment offers an advantage of being able to bring the waveform of the driving current Idrive at the time of the rise of the driving current Idrive close to a rectangular one without disposing any waveform shaping circuit.

In addition, in accordance with this embodiment 1, the driving circuit is so constructed as to draw the suppression current I5 for suppressing the increase in the driving current Idrive which occurs immediately after the occurrence of an undershoot at the time of the fall of the driving current Idrive. Therefore, the present embodiment offers another advantage of being able to bring the waveform of the driving current Idrive at the time of the fall of the driving current Idrive close to a rectangular one without disposing any waveform shaping circuit.

Embodiment 2

Figure 7:
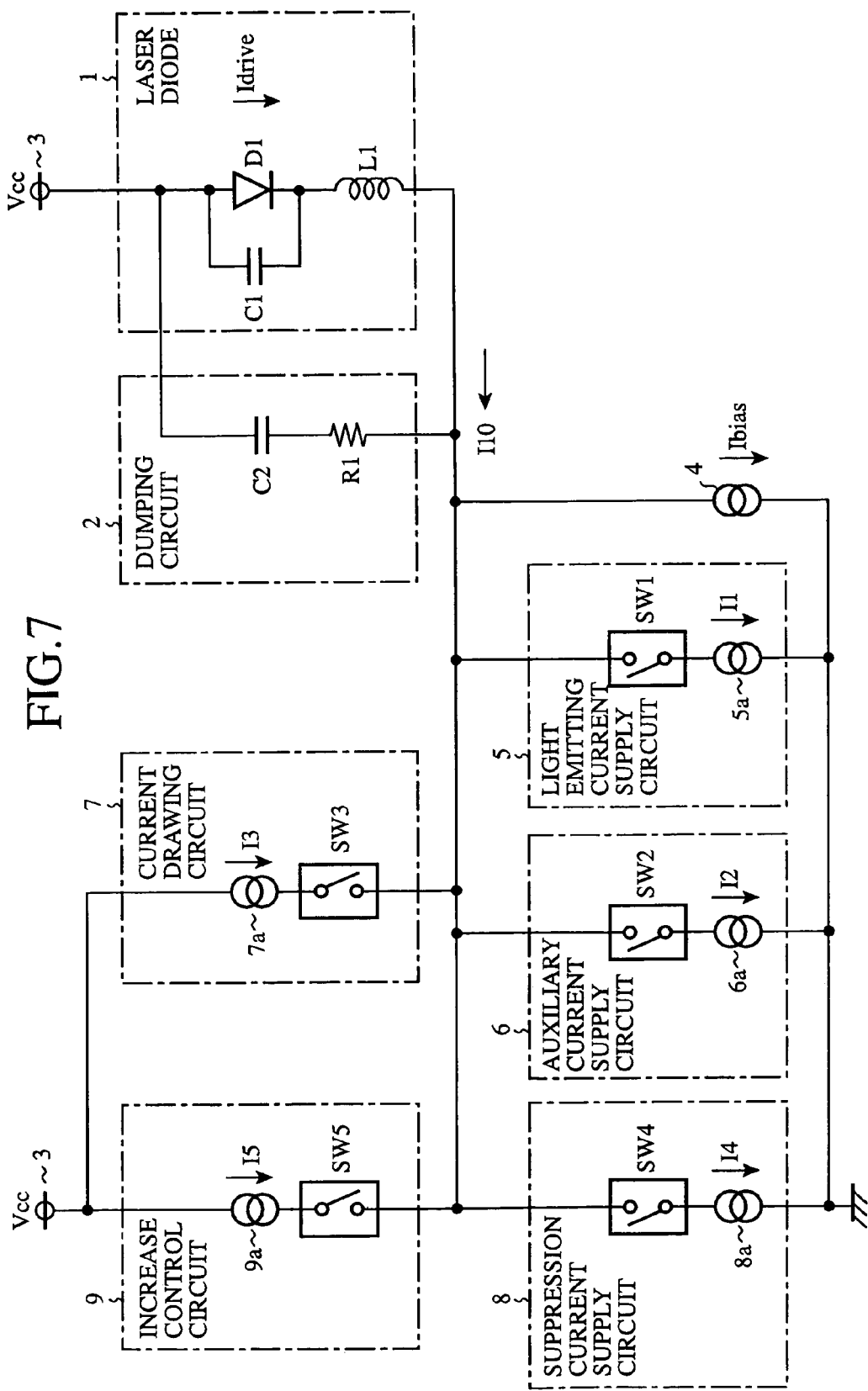
FIG. 7 is a block diagram showing a driving circuit for driving a laser diode in accordance with embodiment 2 of the present invention.

In accordance with embodiment 1, the cathode of the diode D1 included in the laser diode 1 is grounded, as previously mentioned. In contrast, in accordance with this embodiment 2, the anode of the diode D1 included in the laser diode 1 is connected to the power supply 3, as shown in FIG. 7. This embodiment 2 offers the same advantages as provided by above-mentioned embodiment 1.

Embodiment 3

Figure 8:
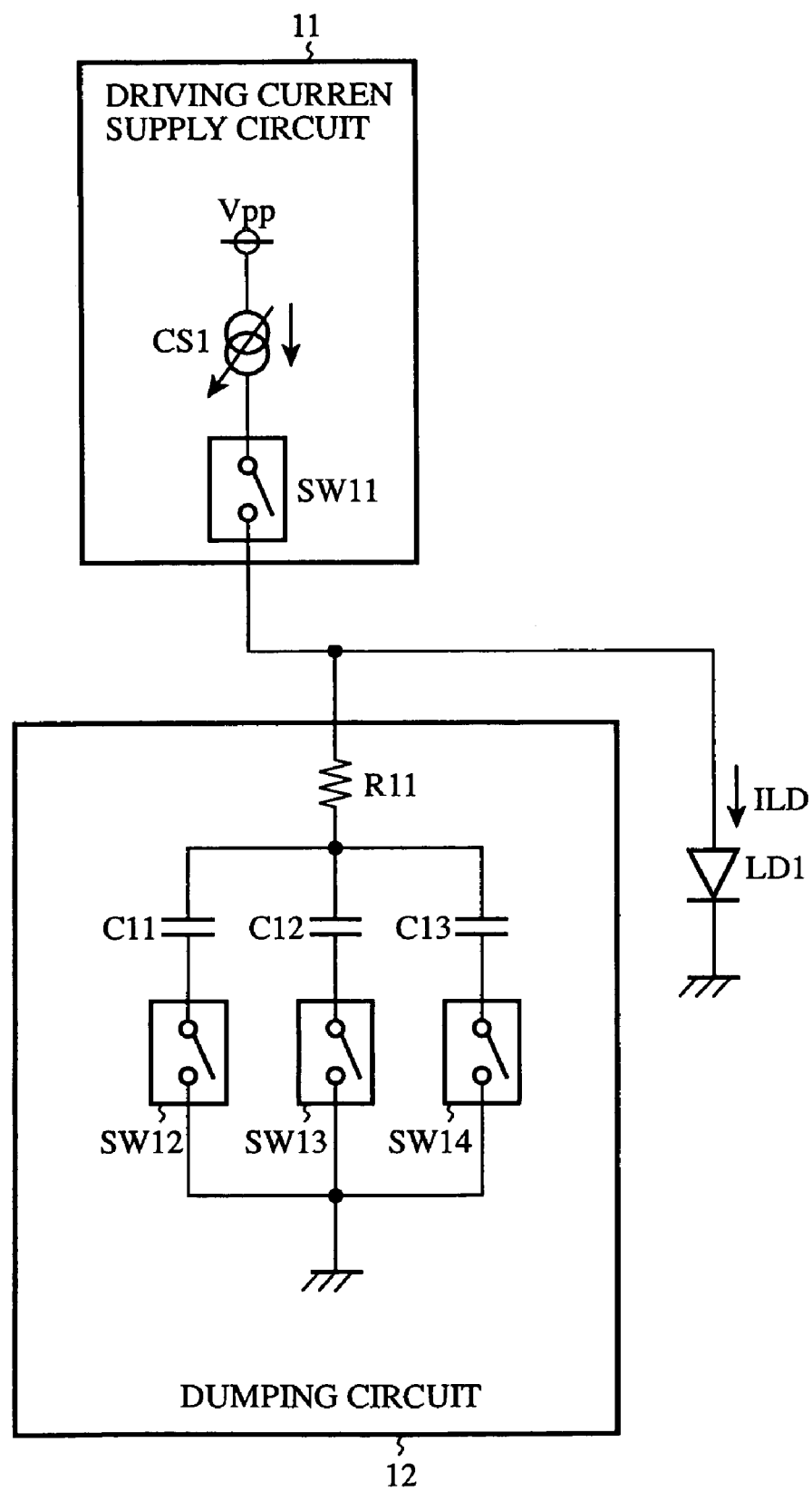
FIG. 8 is a block diagram showing a driving circuit for driving a laser diode in accordance with embodiment 3 of the present invention.

FIG. 8 is a block diagram showing a driving circuit for driving a laser diode in accordance with embodiment 3 of the present invention. In the figure, a driving current supply circuit 11 is constructed of a series circuit in which a power supply for generating a voltage Vpp, a current source CS1 for generating a current pulse ILD (i.e., a driving current) in response to a supply of the voltage Vpp from the power supply, and a switch SW11 arranged between the current source CS1 and the laser diode LD1 are connected in series.

When causing the laser diode LD1 to emit light, the driving current supply circuit 11 supplies the current pulse ILD to the laser diode LD1.

A dumping circuit 12 which is a set of snubber circuits is connected in parallel to the laser diode LD1, and has a function of suppressing both an overshoot which occurs at the time of the rise of the current pulse ILD supplied to the laser diode LD1 from the driving current supply circuit 11, and an undershoot which occurs at the time of the fall of the current pulse ILD. In the dumping circuit 12, a series circuit comprised of a capacitor C11 and a switch SW12, a series circuit comprised of a capacitor C12 and a switch SW13, and a series circuit comprised of a capacitor C13 and a switch SW14 are connected in parallel to one another, and these parallel circuits are connected in series to a resistance element R11. The capacitors C11, C12, and C13 can have different capacitances, or all or some of them can alternatively have the same capacitance.

Thus, in accordance with this embodiment 3, the dumping circuit 12 disposed in parallel with the laser diode LD1 is provided with a first snubber circuit which is a series circuit comprised of the resistance element R11 and the capacitor C11, a second snubber circuit which is a series circuit comprised of the resistance element R11 and the capacitor C12, and a third snubber circuit which is a series circuit comprised of the resistance element R11 and the capacitor C13, and all the snubber circuits or some of them are activated by closing any of the switches SW12, SW13, and SW14, or all or some of these switches so that the total capacitance of the dumping circuit 12 can be varied. The switches SW12, SW13, and SW14 can be independently controlled by a control circuit not shown, or can be independently and manually controlled.

When the switch SW11 is closed, the current outputted from the current source CS1 of the driving current supply circuit 11 flows into both the laser diode LD1, and all or some of the three snubber circuits disposed in the dumping circuit 12. The snubber circuits disposed in the dumping circuit 12 suppress ringing which occurs in the waveform of the high-speed current pulse ILD supplied to the laser diode LD1, and reduce an overshoot and an undershoot which occur in the waveform of output light.

Therefore, when switching among laser diodes LD1 having different characteristics, since it is possible to set the time constant of the dumping circuit 12 to an appropriate value for each of the laser diodes LD1 so as to carry out fine tuning of the waveform of the output light by properly controlling opening and closing of each of the switches SW12, SW13, and SW14, the overshoot and the undershoot which occur in the waveform of the output light for each of the laser diodes LD1 can be reduced sufficiently.

In a case where the driving circuit for driving the laser diode in which the total capacitance of the dumping circuit 12 can be varied is built in an optical pickup integrated circuit, when laser diodes having different electrical characteristics are connected to the driving circuit and one of them is selectively used, since the total capacitance of the dumping circuit 12 can be set to a value suitable for the characteristics of the laser diode currently being used, this embodiment makes it possible to facilitate the fine tuning of the waveform of the output light at the time of manufacturing the optical pickup integrated circuit.

Embodiment 4

Figure 9:
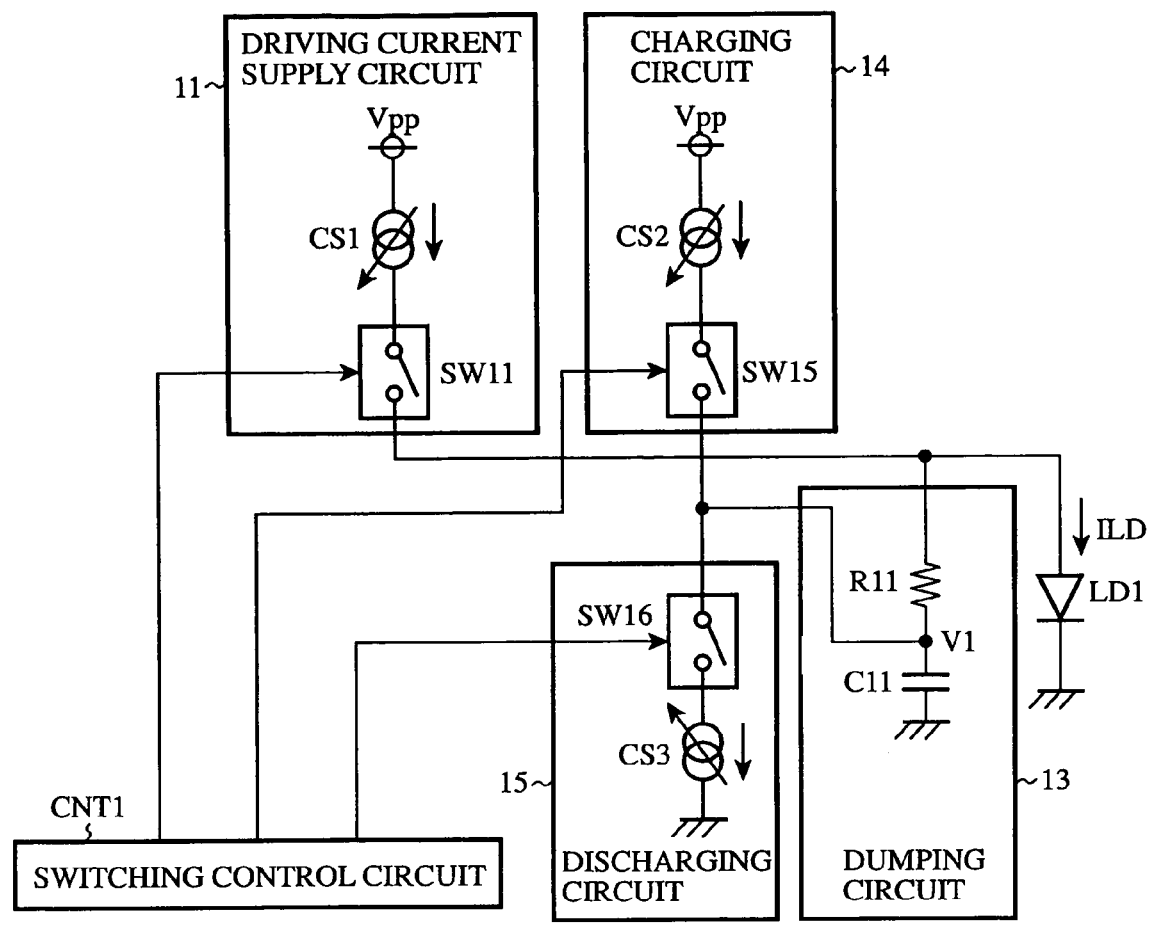
FIG. 9 is a block diagram showing a driving circuit for driving a laser diode in accordance with embodiment 4 of the present invention.

FIG. 9 is a block diagram showing a driving circuit for driving a laser diode in accordance with embodiment 4 of the present invention. In the figure, since the same numerals as shown in FIG. 8 denote the same components as those of FIG. 8 or like components, the explanation of these components will be omitted hereafter. A dumping circuit 13 which is a snubber circuit is connected in parallel to the laser diode LD1, and has a function of suppressing both an overshoot which occurs at the time of the rise of a current pulse ILD supplied to the laser diode LD1 from a driving current supply circuit 11, and an undershoot which occurs at the time of the fall of the current pulse ILD. The dumping circuit 13 is provided with a series circuit comprised of a resistance element R11 and a capacitor C11 (i.e., a capacitive element).

A charging circuit 14 which is charging means is provided with a series circuit in which a power supply for generating a voltage Vpp, a current source CS2 for outputting a charging current (i.e., a current set by an external circuit) in response to a supply of the voltage Vpp from the power supply, and a switch SW15 having an end connected to the current source CS2 and another end connected to a connection point between the resistance element R11 and capacitor C11 of the dumping circuit 13 are connected in series, and has a function for putting an electric charge into the capacitor C11 of the dumping circuit 13 throughout a predetermined time period immediately after the driving current supply circuit 11 starts supplying the current pulse ILD to the laser diode LD1.

A discharging circuit 15 which is discharging means is provided with a series circuit in which a switch SW16 having an end connected with the other end of the switch SW15 and a current source CS3 having an end connected with the other end of the switch SW16 and another end connected with a ground, for outputting a current set by the external circuit are connected in series, and has a function of drawing the electric charge put into the capacitor C11 of the dumping circuit 13 throughout a predetermined time period immediately after the driving current supply circuit 11 stops the supply of the current pulse ILD to the laser diode LD1. A switching control circuit CNT1 is provided with a function of individually controlling opening and closing of each of the switches SW11, SW15, and SW16.

Figure 10:
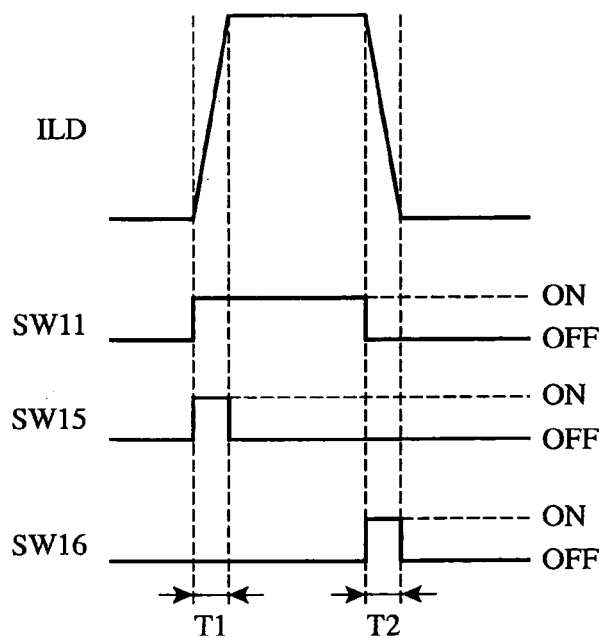
FIG. 10 is a timing chart for explaining the operation of the driving circuit for driving the laser diode of FIG. 9.

FIG. 10 is a timing chart for explaining the operation of the driving circuit for driving the laser diode of FIG. 9. In FIG. 10, the high-speed current pulse ILD outputted from the current source CS1 of the driving current supply circuit 11 is supplied to the laser diode LD1 via the switch SW11 throughout a time period during which the switch SW11 is closed (i.e., switched on) by the switching control circuit CNT1. At this time, the switch SW15 is controlled by the switching control circuit CNT1 so that it is closed throughout only a predetermined time period T1 immediately after the switch SW11 has been closed. In addition, the switch SW16 is controlled by the switching control circuit CNT1 so that it is closed throughout only a predetermined time period T2 immediately after the switch SW11 has been closed.

Next, the status of the driving circuit immediately after the switch SW11 is closed will be explained. The current outputted from the current source CS1 of the driving current supply circuit 11 is divided into a current pulse ILD which flows into the laser diode LD1, and a current which flows into the capacitor C11 of the dumping circuit 13 via the resistance element R11. While the potential of the anode of the laser diode LD1 is decided by the current pulse ILD flowing into the laser diode LD1, the latter current keeps flowing into the capacitor C11 until the potential V1 (i.e., the terminal voltage V1 of the capacitor C11) of the connection point with the resistance element R1 becomes equal to the potential of the anode of the laser diode LD1. Therefore, the rising time T1 of the current pulse ILD which flows into the laser diode LD1 becomes longer than that in a case where the dumping circuit 13 is not connected in parallel to the laser diode LD1.

In accordance with this embodiment 4, the switch SW15 is closed at the same time when the switch SW11 is closed and throughout the rising time T1 of the current pulse ILD immediately after the switch SW11 has been closed, a current pulse which is the charging current is supplied from the current source CS2 of the charging circuit 14 to the capacitor C11 of the dumping circuit 13. Therefore, the terminal voltage V1 of the capacitor C11 quickly becomes equal to the potential of the anode of the laser diode LD1. As a result, since most of the current outputted from the current source CS1 of the driving current supply circuit 11 is supplied to the laser diode LD1, the rising time T1 of the current pulse ILD which flows into the laser diode LD1 is reduced.

After the switch SW15 is then opened by the switching control circuit CNT1 and the dumping circuit is disconnected from the current source CS2 of the charging circuit 14, the current outputted from the current source CS1 of the driving current supply circuit 11 flows again into the capacitor C11 of the dumping circuit 13 via the resistance element R11 and is therefore charged. As a result, the change in the waveform of the current pulse ILD which flows into the laser diode LD1 is gentled. Therefore, when the resistance of the resistance element R11 of the dumping circuit 13 and the capacitance of the capacitor C11 of the dumping circuit 13 are adjusted to appropriate values, respectively, ringing which appears after the rise of the current pulse ILD which flows into the laser diode LD1 can be suppressed.

Next, the status of the driving circuit immediately after the switch SW11 is opened will be explained. The switch SW16 is closed by the switching control circuit CNT1 throughout the falling time T2 of the current pulse ILD immediately after the switch SW11 has been opened. As a result, the current source CS3 of the discharging circuit 15 which has been adjusted appropriately acts so as to draw the electric charge put into the capacitor C11 of the dumping circuit 13. The amount of the current outputted by the current source CS3 is adjusted so that the potential of the anode of the laser diode LD1 becomes equal to the terminal voltage V1 of the capacitor C11 at the time when the switch SW11 is opened.

After the switch SW16 is opened by the switching control circuit CNT1 and the dumping circuit is disconnected from the current source CS3 of the discharging circuit 15, since the current pulse ILD which flows into the laser diode LD1 varies at a time constant decided by resistance components, capacity components, and inductance components which the resistance element R11, the capacitor C11, and the laser diode LD1 etc. have, ringing can be suppressed in a state in which the resistance of the resistance element R11 and the capacitance of the capacitor C11 have been adjusted to appropriate values, respectively.

Thus, this embodiment 4 offers an advantage of being able to reduce an overshoot and an undershoot which occur in the waveform of the output light, and to shorten the rising time and falling time of the waveform of the output light.

In addition, the driving circuit includes the switching control circuit CNT1 for setting the closing time periods during which the switches SW15 and SW16 are closed, respectively, (i.e., the widths of pulses for closing the switches, respectively) and the amounts (i.e., the amplitudes) of the currents respectively outputted from the current source CS2 and CS3 to arbitrary values, respectively. Therefore, even when the laser diode LD1 has a different parasitic element component, the driving circuit can respond flexibly to the change in the parasitic element component of the laser diode.

Embodiment 5

Figure 11:
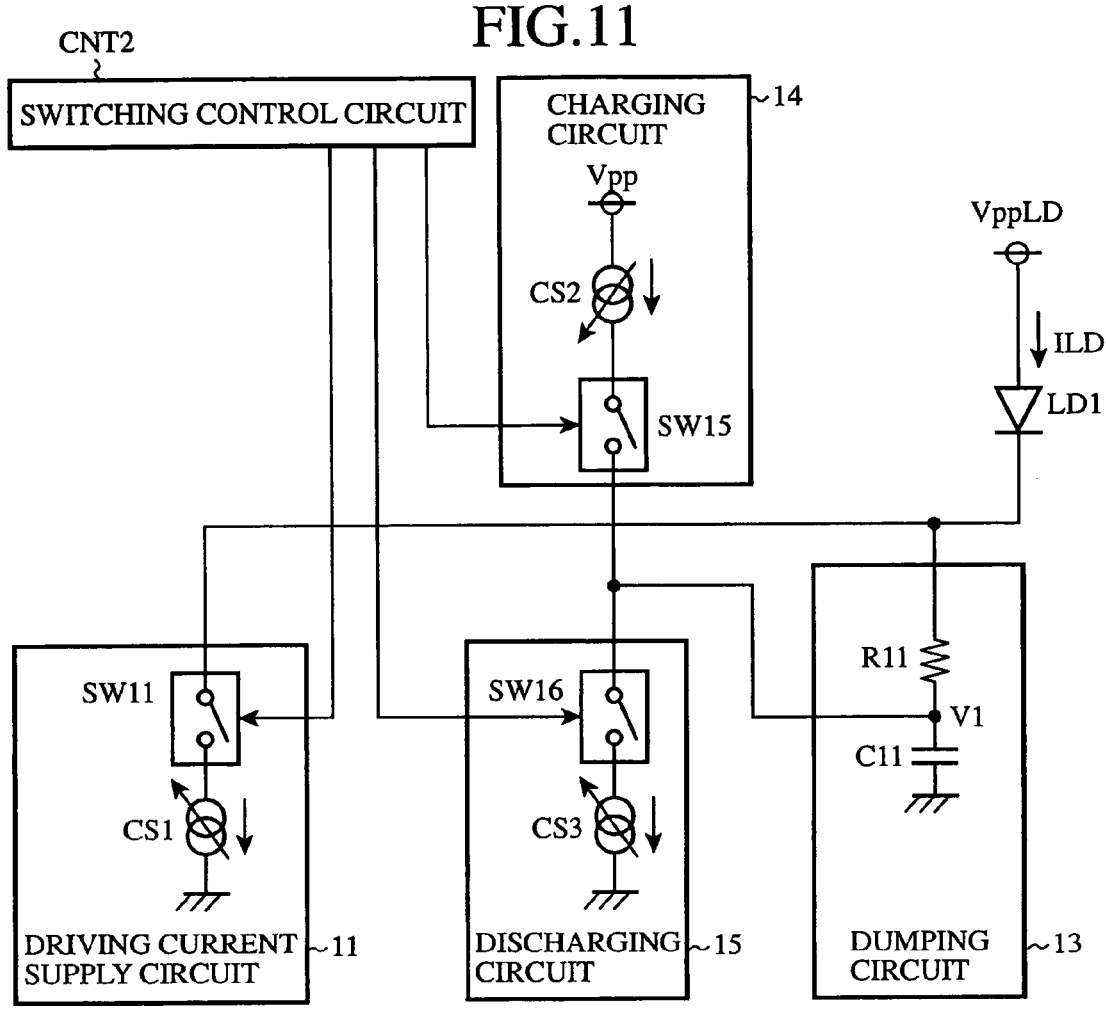
FIG. 11 is a block diagram showing a driving circuit for driving a laser diode in accordance with embodiment 5 of the present invention.

FIG. 11 is a block diagram showing a driving circuit for driving a laser diode in accordance with embodiment 5 of the present invention. This embodiment 5 is a variant of above-mentioned embodiment 4. In FIG. 11, the anode of the laser diode LD1 is connected to a power supply for outputting a voltage VppLD, and the cathode of the laser diode LD1 is connected to both an end of a resistance element R11 of a dumping circuit 13 and an end of a switch SW11 of a driving current supply circuit 11. A current source CS1 is connected between another end of the switch SW11 and a ground. A capacitor C11 is connected between another end of the resistance element R11 and the ground.

Figure 12:
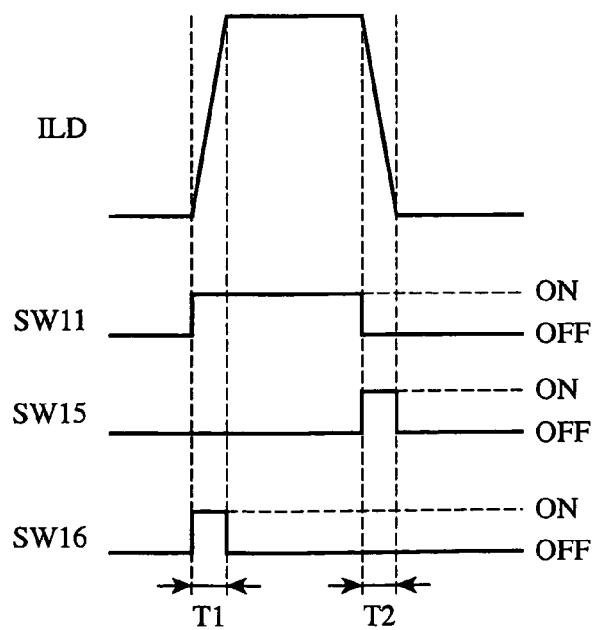
FIG. 12 is a timing chart for explaining the operation of the driving circuit for driving the laser diode of FIG. 11.

A current source CS2 and a switch SW15 of a charging circuit 14, and a switch SW16 and a current source CS3 of a discharging circuit 15 are arranged between the power supply (i.e., the voltage VppLD) and the ground in the same way as shown in FIG. 9 of above-mentioned embodiment 4. In the example of FIG. 11, a switching control circuit CNT2 is disposed instead of the switching control circuit CNT1 of FIG. 9. As shown in FIG. 12, the switching control circuit CNT2 controls the switch SW16 at the time of the rise of the current pulse ILD, and also controls the switch SW15 at the time of the fall of the current pulse ILD.

FIG. 12 is a timing chart for explaining the operation of the driving circuit for driving the laser diode of FIG. 11. Since the anode of the laser diode LD1 is connected to the power supply (i.e., the voltage VppLD), when the switch SW1 is closed by the switching control circuit CNT2 and the cathode of the laser diode LD1 is connected to the current source CS1 of the driving current supply circuit 11 via the switch SW11, the current source CS1 draws a current set by an external circuit from the laser diode LD1 so as to cause the current to flow into the laser diode. As a result, the current pulse ILD flows into the laser diode LD1.

At this time, the switch SW16 is closed by the switching control circuit CNT2 throughout the rising time T1 of the current pulse ILD immediately after the switch SW11 has been closed, an electric charge put into the capacitor C11 included in the dumping circuit 13 is drawn by the current source CS3 of the discharging circuit 15. As a result, the rising time of the current pulse ILD which flows into the laser diode LD1 can be shortened. Since the driving circuit is placed in the same state as previously mentioned in embodiment 4 after the switch SW16 has been closed by the switching control circuit CNT2, waveform stabilization is carried out similarly. The switch SW15 is closed by the switching control circuit CNT2 and the capacitor C11 included in the dumping circuit 13 becomes charged by the current source CS2 of the charging circuit 14 throughout the falling time T2 of the current pulse ILD immediately before the switch SW1 is opened. As a result, the waveform stabilization is carried out as in the case of above-mentioned embodiment 4.

Thus, in accordance with this embodiment 5, even if the laser diode LD1 and the current source CS1 are interchanged, the same effect and advantage as those provided by above-mentioned embodiment 4 can be offered.

Embodiment 6

Figure 13:
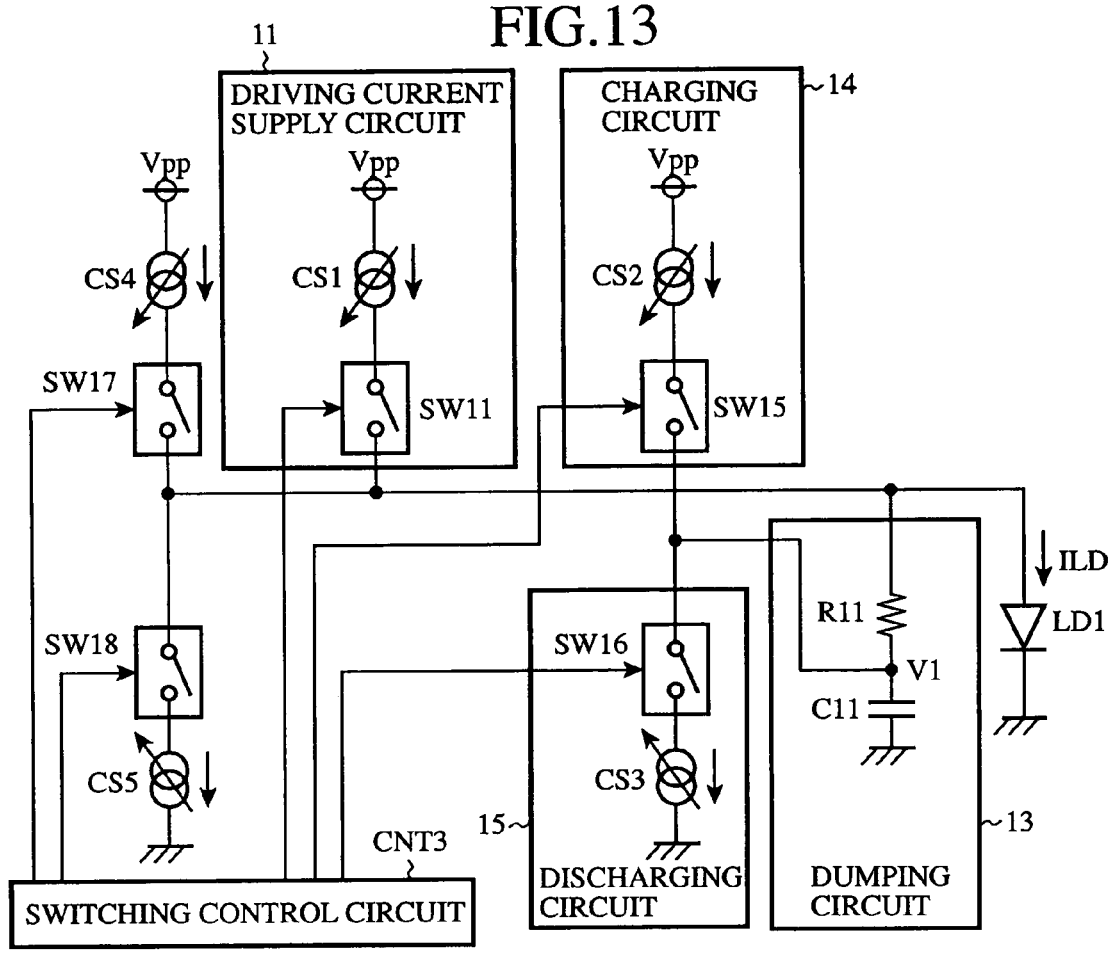
FIG. 13 is a block diagram showing a driving circuit for driving a laser diode in accordance with embodiment 6 of the present invention.

FIG. 13 is a block diagram showing a driving circuit for driving a laser diode in accordance with embodiment 6 of the present invention. This embodiment 6 shows an extended example of above-mentioned embodiment 4. In the example of FIG. 13, current sources CS4 and CS5, and switches SW17 and SW18 are added to the structure of above-mentioned embodiment 4 shown in FIG. 9. Instead of the switching control circuit CNT1 of FIG. 9, a switching control circuit CNT3 is disposed in the driving circuit of this embodiment. The structure of the additional components will be explained hereafter.

Figure 14:
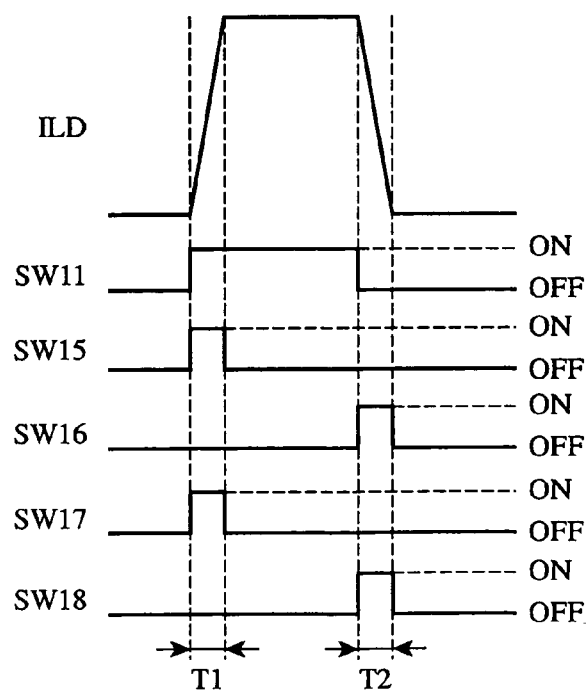
FIG. 14 is a timing chart for explaining the operation of the driving circuit for driving the laser diode of FIG. 13.

The power supply (i.e., the voltage VPP) is connected to one end of the switch SW17 via the current source CS4, and another end of the switch SW17 is connected to both the other end of the switch SW11 and one end of the switch SW18. Another end of the switch SW18 is connected to the ground via the current source CS5. The switching control circuit CNT3 is provided with a function of individually controlling opening and closing of each of the switches SW11, SW15, SW16, SW17, and SW18, as shown in FIG. 14. Driving means is comprised of the current sources CS4 and CS5 and the switches SW17 and SW18.

FIG. 14 is a timing chart for explaining the operation of the driving circuit for driving the laser diode of FIG. 13. As shown in FIG. 14, the switch SW17 is closed by the switching control circuit CNT3, like the switch SW15, throughout the rising time T1 of the current pulse ILD immediately after the switch SW11 has been closed. The switch SW18 is closed by the switching control circuit CNT3, like the switch SW16, throughout the falling time T2 of the current pulse ILD immediately after the switch SW11 has been opened.

According to this structure, since the switch SW11 is closed and the switch SW17 is then closed at the same time when the current flows into the laser diode LD1, a current can be also supplied from the current source CS4 to the laser diode LD1 and therefore the rising time of the current pulse ILD which flows into the laser diode LD1 can be further shortened.

In addition, since the switch SW11 is closed and the switch SW18 is then closed at the same time when the flow of the current pulse ILD into the laser diode LD1 is stopped, the current source CS5 can draw a current which keeps flowing under influence of the parasitic capacitance, parasitic inductance component, etc. of the laser diode LD1, and the falling time of the current pulse ILD can be shortened.

Thus, this embodiment 6 can offer an advantage of being able to further shorten both the rising time and falling time of the current pulse ILD which flows into the laser diode LD1, in addition to the same effect and advantage as those provided by above-mentioned embodiment 4.

Embodiment 7

Figure 15:
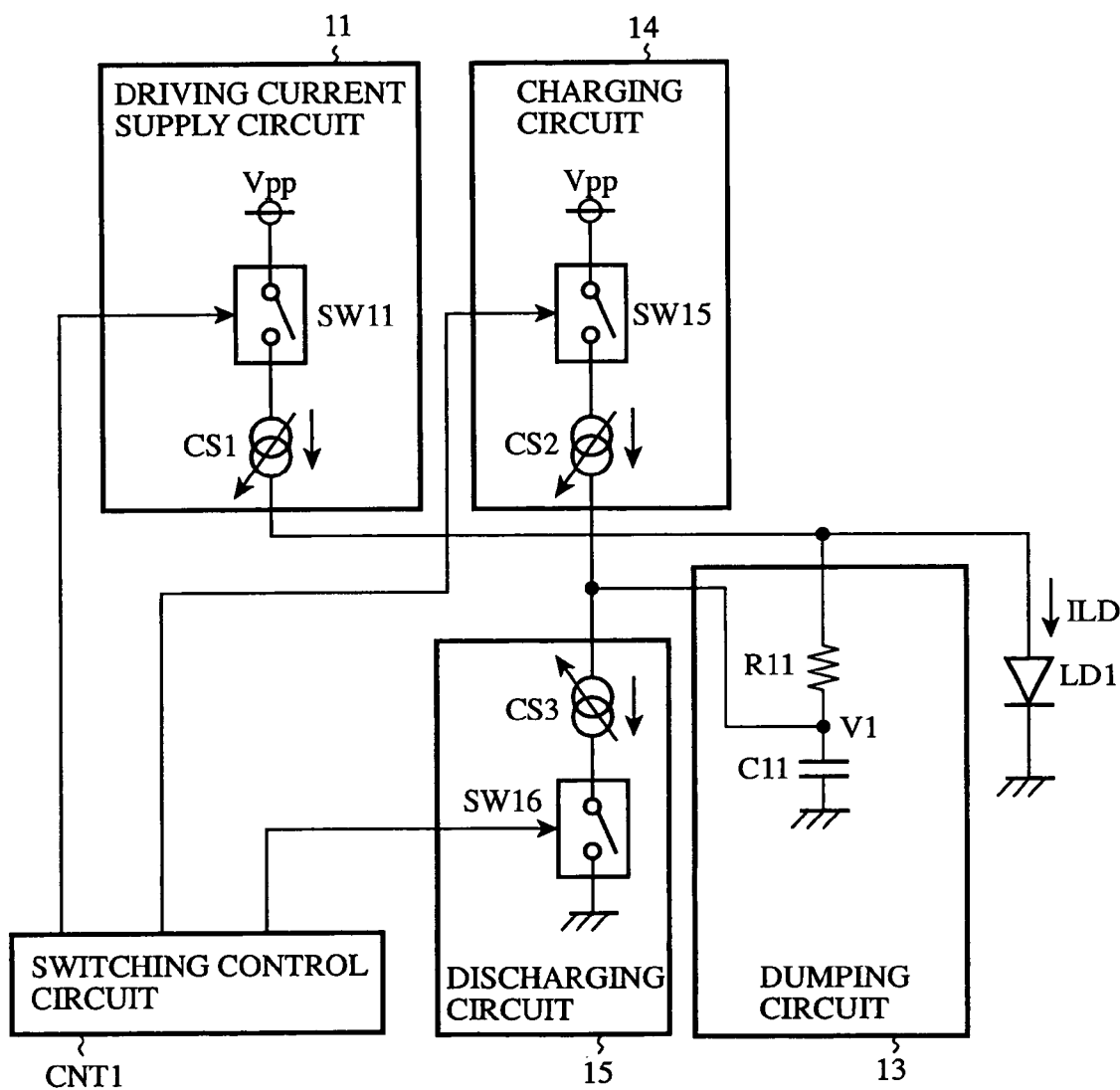
FIG. 15 is a block diagram showing a driving circuit for driving a laser diode in accordance with embodiment 7 of the present invention.

FIG. 15 is a block diagram showing a driving circuit for driving a laser diode in accordance with embodiment 7 of the present invention. In the driving circuit in accordance with this embodiment 7, the current source CS and the switch SW are interchanged in each of the driving current supply circuit 11, charging circuit 14, and discharging circuit 15 of the driving circuit of above-mentioned embodiment 4 shown in FIG. 9. In the example of FIG. 15, one end of the switch SW11 is connected to the power supply (i.e., the voltage Vpp), and the input terminal of the current source CS1 is connected to another end of the switch SW11. The anode of the laser diode LD1 and an end of the resistance element R11 are connected to the output terminal of the current source CS1. The capacitor C11 is arranged between another end of the resistance element R11 and the ground.

One end of the switch SW15 is connected to the power supply (i.e., the voltage Vpp), and the input terminal of the current source CS2 is connected to another end of the switch SW15. Both a connection point between the resistance element R11 and the capacitor C11 and the input terminal of the current source CS3 are connected to the output terminal of the current source CS2. The output terminal of the current source CS3 is connected to the ground via the switch SW16.

Even in this structure, since the input terminal of the current source CS1 is connected to the power supply (i.e., the voltage Vpp) when the switch SW11 is closed by the switching control circuit CNT1, a current is supplied to the laser diode LD1 from the output terminal of the current source CS1. When the switch SW15 is simultaneously closed by the switching control circuit CNT1, since the input terminal of the current source CS2 is connected to the power supply (i.e., the voltage Vpp), a charging current is supplied from the output terminal of the current source CS2 to the capacitor C11 of the dumping circuit 13. Then, since the output terminal of the current source CS3 is connected to the ground when the switch SW16 is closed at the same time when the switch SW11 is opened by the switching control circuit CNT1, an electric charge put into the capacitor C11 is drawn.

Therefore, even when the current source CS and the switch SW are interchanged in each of the driving current supply circuit 11, charging circuit 14, and discharging circuit 15 of the driving circuit of above-mentioned embodiment 4 shown in FIG. 9, the same effect and advantage as those provided by above-mentioned embodiment 4 can be offered. Although this embodiment 7 shows an application to above-mentioned embodiment 4, it is understood that the current source CS and the switch SW can be interchanged in each of the driving current supply circuit 11, charging circuit 14, and discharging circuit 15 of the driving circuit in accordance with any one of above-mentioned embodiments 3, 5, and 6.

Embodiment 8

Figure 16:
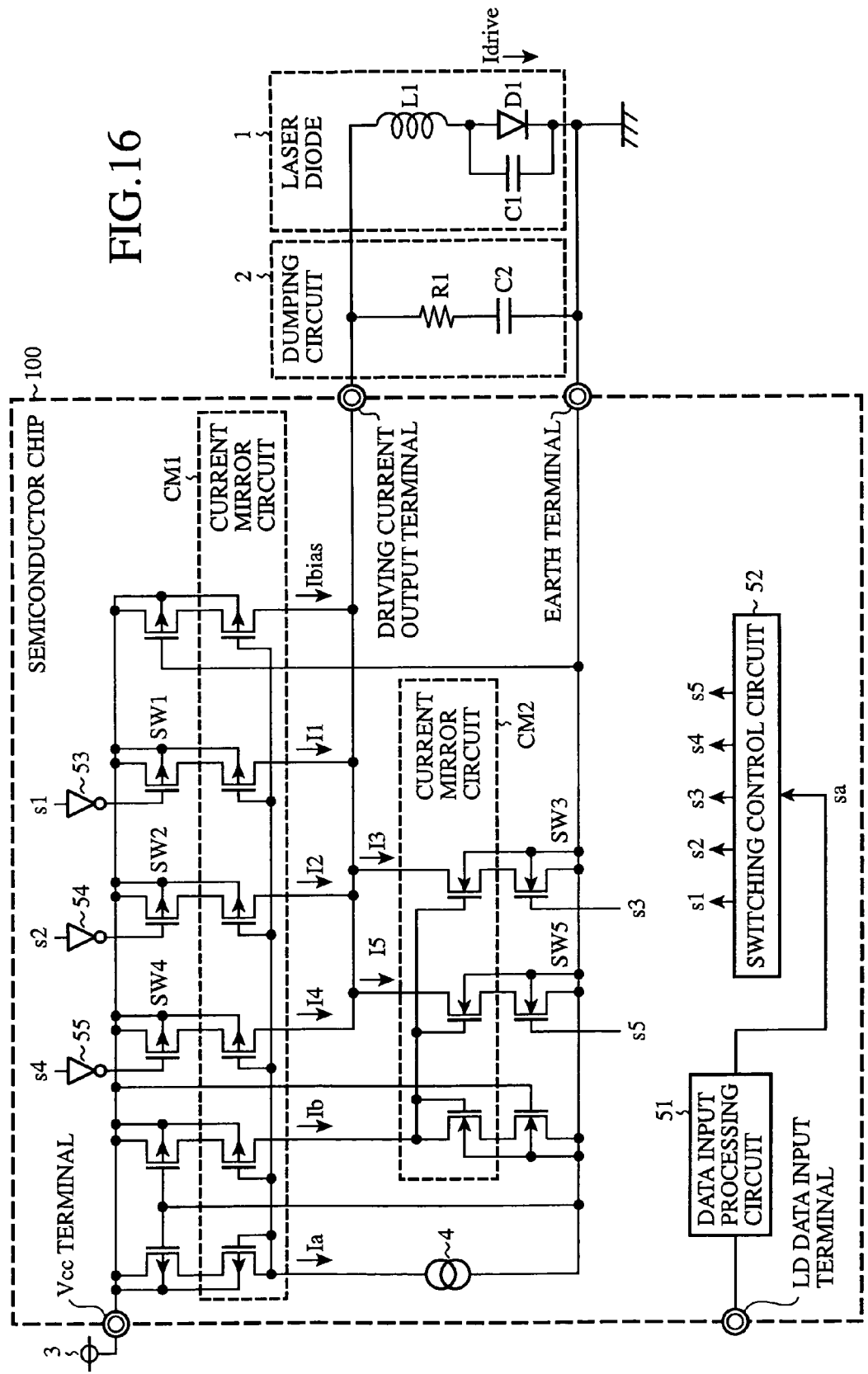
FIG. 16 is a detailed circuit diagram showing a driving circuit for driving a laser diode in accordance with embodiment 8 of the present invention.

FIG. 16 is a detailed circuit diagram showing a driving circuit for driving a laser diode in accordance with embodiment 8 of the present invention. In other words, FIG. 16 is a detailed circuit diagram corresponding to the block diagram of FIG. 1. In the example of FIG. 16, while a circuit corresponding to the light emitting current supply circuit 5, auxiliary current supply circuit 6, current drawing circuit 7, suppression current supply circuit 8, and increase control circuit 9 of the driving circuit of FIG. 1 are mounted in a semiconductor chip 100, the laser diode 1 and the dumping circuit 2 are disposed outside the semiconductor chip 100 such that they can be adjusted. As an alternative, the laser diode 1 and the dumping circuit 2 can be mounted in the semiconductor chip 100.

A current mirror circuit CM1 has a function of generating a bias current Ibias in response to a supply of a voltage Vcc from a power supply 3, and constantly supplying the bias current Ibias to the laser diode 1, and is equipped with a circuit which corresponds to the current sources 5a, 6a, and 8a respectively included in the light emitting current supply circuit 5, auxiliary current supply circuit 6, and suppression current supply circuit 8 of the driving circuit. The current mirror circuit CM1 is constructed so that a transistor is connected in series between the source of a transistor, which is placed on a side of connection with the diode, and the voltage Vcc, in order to compensate for a potential difference caused by the on resistance of each of the switches SW1, SW2, and SW4.

A current mirror circuit CM2 corresponds to the current sources 7a and 9a respectively included in the current drawing circuit 7 and increase control circuit 9 of the driving circuit. The current mirror circuit CM2 is constructed so that a transistor is connected in series between the source of a transistor, which is placed on a side of connection with the diode, and the ground, in order to compensate for a potential difference caused by the on resistance of each of the switches SW3 and SW5.

The switches SW1, SW2, and SW4 are PMOS transistors connected between the source of the current mirror circuit CM1 and the voltage Vcc, and switching between the on and off states of each of these switches is controlled by a switching control circuit 52. The switches SW3 and SW5 are NMOS transistors connected between the source of the current mirror circuit CM2 and the ground, and switching between the on and off states of each of these switches is controlled by the switching control circuit 52.

A data input processing circuit 51 carries out a process of generating a control signal sa used for controlling the light emitting of the laser diode 1. A switching control circuit 52 carries out a process of generating control signals s1 to s5 used for controlling the switching of the on and off states of the switches SW1 to SW5 according to the control signal sa generated by the data input processing circuit 51. An inverter 53 inverts the logic of the control signal s1 generated by the switching control circuit 52, and carries out a process of outputting the inverted control signal s1 to the switch SW1. An inverter 54 inverts the logic of the control signal s2 generated by the switching control circuit 52, and carries out a process of outputting the inverted control signal s2 to the switch SW2. An inverter 55 inverts the logic of the control signal s4 generated by the switching control circuit 52, and carries out a process of outputting the inverted control signal s4 to the switch SW4.

Figure 17:
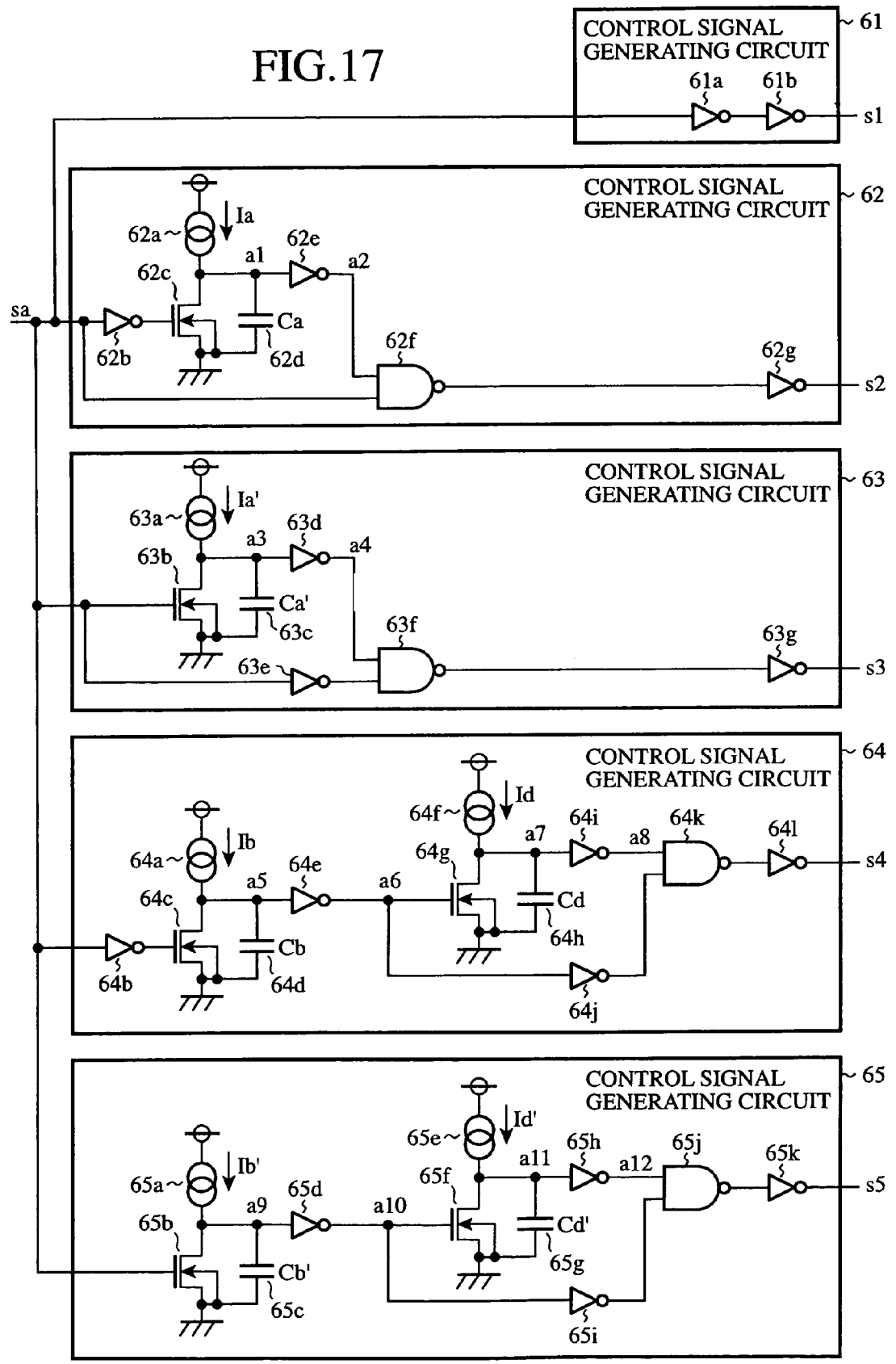
FIG. 17 is a detailed circuit diagram showing the internal structure of a switching control circuit of FIG. 16.

FIG. 17 is a detailed circuit diagram showing the internal structure of the switching control circuit 52 of FIG. 16. In the figure, a control signal generating circuit 61 generates the control signal s1 used for controlling the switch SW1 from the control signal sa generated by the data input processing circuit 51, and is provided with an inverter 61a for inverting the logic of the control signal sa generated by the data input processing circuit 51, and an inverter 61b for inverting the logic of the control signal sa outputted from the inverter 61a, and for outputting the inverted control signal sa, as the control signal s1, to the inverter 53. The control signal s1 outputted from the inverter 61b is substantially the same as the control signal sa generated by the data input processing circuit 51. Therefore, the inverters 61a and 61b can be removed from the control signal generating circuit 61.

A control signal generating circuit 62 generates the control signal s2 used for controlling the switch SW2 from the control signal sa generated by the data input processing circuit 51, and is provided with a current source 62a, inverters 62b, 62e, and 62g, a transistor 62c, a capacitor 62d, and a NAND circuit 62f. A control signal generating circuit 63 generates the control signal s3 used for controlling the switch SW3 from the control signal sa generated by the data input processing circuit 51, and is provided with a current source 63a, a transistor 63b, a capacitor 63c, inverters 63d, 63e, and 63g, and a NAND circuit 63f.

Figure 18:
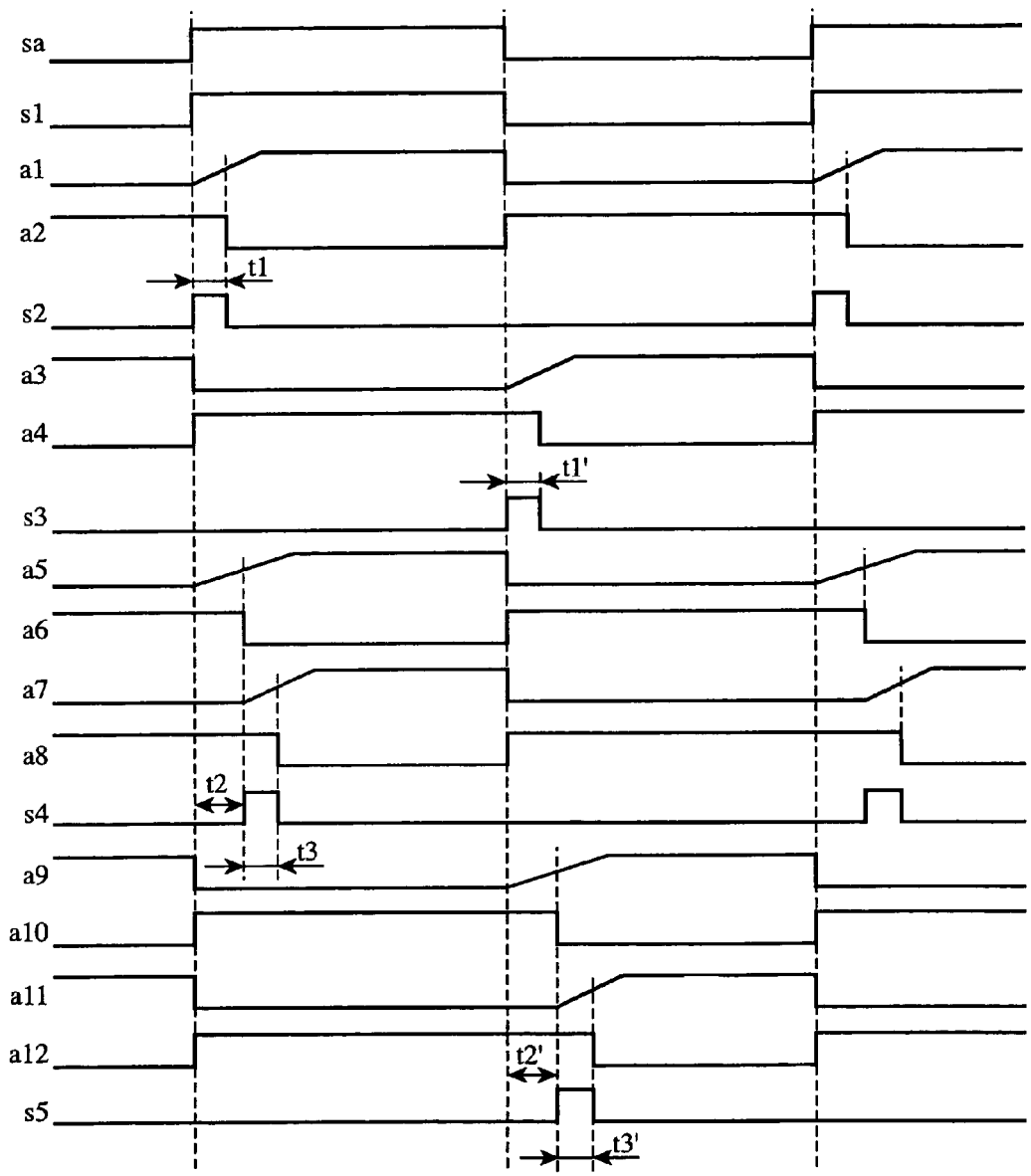
FIG. 18 is a timing chart of the switching control circuit of FIG. 16.

A control signal generating circuit 64 generates the control signal s4 used for controlling the switch SW4 from the control signal sa generated by the data input processing circuit 51, and is provided with current sources 64a and 64f, inverters 64b, 64e, 64i, 64j, and 64l, transistors 64c and 64g, capacitors 64d and 64h, and a NAND circuit 64k. A control signal generating circuit 65 generates the control signal s5 used for controlling the switch SW5 from the control signal sa generated by the data input processing circuit 51, and is provided with current sources 65a and 65e, inverters 65d, 65h, 65i and 65k, transistors 65b and 65f, capacitors 65c and 65g, and a NAND circuit 65j. FIG. 18 is a timing chart showing the operation of the switching control circuit 52 of FIG. 16.

Next, the operation of the driving circuit in accordance with this embodiment of the present invention will be explained. The driving circuit in accordance with this embodiment basically operates in the same way that that of above-mentioned embodiment 1 does. As shown in FIG. 16, the driving circuit in accordance with this embodiment is equipped with the data input processing circuit 51 and the switching control circuit 52. Therefore, processing carried out by the data inputting processing circuit 51 and the switching control circuit 52 will be explained hereafter.

The data input processing circuit 51 generates a control signal sa having a High level and then outputs it to the switching control circuit 52 when causing the laser diode 1 to emit light, whereas it generates a control signal sa having a Low level and then outputs it to the switching control circuit 52 when not causing the laser diode 1 to emit light, as shown in FIG. 18. For simplicity's sake, assume that the data input processing circuit 51 generates a control signal sa having a High level and then outputs it to the switching control circuit 52.

In response to the control signal sa generated by the data input processing circuit 51, the switching control circuit 52 generates control signals s1 to s5 used for controlling the on and off states of the switches SW1 to SW5 according to the control signal sa. In other words, the control signal generating circuit 61 of the switching control circuit 52 outputs a control signal s1, which is substantially the same as the control signal sa, to the inverter 53 in response to the control signal sa having a High level from the data input processing circuit 51. Since the control signal s1 having a High level outputted from the control signal generating circuit 61 of the switching control circuit 52 is inverted by the inverter 53, and therefore the control signal s1 having a Low level is outputted to the switch SW1, the switch SW1 is switched on and is kept in the on state throughout a time period during which the control signal sa generated by the data input processing circuit 51 is at a High level.

Since the current mirror circuit CM1 generates the bias current Ibias in response to the supply of the voltage Vcc from the power supply 3 and also generates a light emitting current I1 in response to the supply of the voltage Vcc from the power supply 3, a driving current Idrive (=the light emitting current I1+the bias current Ibias) is supplied to the laser diode 1.

The control signal generating circuit 62 of the switching control circuit 52 generates a control signal s2 for switching on the switch SW2 and keeping it in the on state throughout a time period t1 at the same time when the switch SW1 is switched on in order to speed up the rise of the driving current Idrive supplied by the current mirror circuit CM1, as shown in FIG. 18. The time period t1 is decided by the capacitance Ca of the capacitor 62d and a reference current Ia in the control signal generating circuit 62. Since the control signal s2 having a High level outputted from the control signal generating circuit 62 of the switching control circuit 52 is inverted by the inverter 54 and therefore the control signal s2 having a Low level is outputted to the switch SW2 throughout the time period t1, the switch SW2 is kept in the on state throughout the time period t1.

As a result, since the current mirror circuit CM1 generates a boost current I2 throughout the time period t1 in response to the supply of the voltage Vcc from the power supply 3, the driving current Idrive supplied to the laser diode 1 becomes (the light emitting current I1+the bias current Ibias+the boost current I2), and therefore the rise of the driving current Idrive becomes steep. Since the laser diode 1 contains an inductor L1 and a capacitor C1, an overshoot occurs at the time of the rise of the driving current Idrive according to a resonance phenomenon caused by the inductor L1 and capacitor C1 of the laser diode, and the amount of the driving current Idrive decreases greatly immediately after the occurrence of the overshoot and the waveform of the driving current Idrive does not become a rectangular one (refer to FIG. 4), as previously mentioned in embodiment 1.

The control signal generating circuit 64 of the switching control circuit 52 generates a control signal s4 used for switching on the switch SW4 and keeping it in the on state throughout a time period t3 after the switch SW1 has been switched on and the time period t2 has elapsed in order to reduce the decrease in the amount of the driving current Idrive which occurs immediately after the occurrence of the overshoot, as shown in FIG. 18. The time period t2 is decided by the capacitance Cb of the capacitor 64d and a reference current Ib in the control signal generating circuit 64, and the time period t3 is decided by the capacitance Cd of the capacitor 64h and a reference current Id in the control signal generating circuit 64. Since the control signal s4 having a High level outputted from the control signal generating circuit 64 of the switching control circuit 52 is inverted by the inverter 55 and therefore the control signal s4 having a Low level is outputted to the switch SW4 throughout the time period t3, the switch SW4 is kept in the on state throughout the time period t3.

As a result, since the current mirror circuit CM1 generates a suppression current I4 throughout the time period t3 in response to the supply of the voltage Vcc from the power supply 3, the suppression current I4 is added to the driving current Idrive immediately after the occurrence of the overshoot, and the decrease in the amount of the driving current Idri is reduced.

Next, switching from the on state to the off state of the laser diode 1 will be explained. In this case, the data input processing circuit .51 generates a control signal sa having a Low level, and outputs it to the switching control circuit 52. When the control signal sa outputted from the data input processing circuit 51 makes a transition from a High level to a Low level, the control signal generating circuit 61 of the switching control circuit 52 outputs a control signal s1 having a Low level to the inverter 53.

Since the control signal s1 having a Low level outputted from the control signal generating circuit 61 of the switching control circuit 52 is inverted by the inverter 53 and therefore the control signal s1 having a High level is outputted to the switch SW1 throughout a time period during which the control signal sa generated by the data input processing circuit 51 is at a Low level, the switch SW1 is switched off and is kept in the off state throughout the time period. As a result, since the current mirror circuit CM1 stops the generation of the light emitting current I1, the driving current Idrive supplied to the laser diode 1 falls, and, finally, only the bias current Ibias remains as the current supplied to the laser diode.

The control signal generating circuit 63 of the switching control circuit 52 generates a control signal s3 used for switching on the switch SW3 and keeping it in the on state throughout a time period t1' at the same time when the switch SW1 is switched off in order to speed up the fall of the driving current Idrive (=the bias current Ibias), as shown in FIG. 18. The time period t1' is decided by the capacitance Ca' of the capacitor 63c and a reference current Ia' in the control signal generating circuit 63. Since the control signal s3 outputted from the control signal generating circuit 63 of the switching control circuit 52 is outputted to the switch SW3 throughout the time period t1', the switch SW3 is kept in the on state throughout the time period t1'.

As a result, since the current mirror circuit CM2 generates a drawing current I3 throughout the time period t1' in response to the supply of the voltage Vcc from the power supply 3, a drawn current I3 is drawn from the driving current Idrive supplied to the laser diode 1, and the fall of the driving current Idrive becomes steep. Since the laser diode 1 contains the inductor L1 and the capacitor C1, an undershoot occurs at the time of the fall of the driving current Idrive according to the resonance phenomenon caused by the inductor L1 and capacitor C1 of the laser diode, and the amount of the driving current Idrive increases greatly immediately after the occurrence of the undershoot and the waveform of the driving current Idrive does not become a rectangular one (refer to FIG. 4), as previously mentioned in embodiment 1.

The control signal generating circuit 65 of the switching control circuit 52 generates a control signal s5 used for switching on the switch SW5 and keeping it in the on state throughout a time period t3' after the switch SW1 has been switched off and the time period t2' has elapsed in order to reduce the increase in the driving current Idrive which occurs immediately after the occurrence of the undershoot, as shown in FIG. 18. The time period t2' is decided by the capacitance Cb' of the capacitor 65c and a reference current Ib' in the control signal generating circuit 65, and the time period t3' is decided by the capacitance Cd' of the capacitor 65g and a reference current Id' in the control signal generating circuit 65. Since the control signal s5 having a High level outputted from the control signal generating circuit 65 of the switching control circuit 52 is outputted to the switch SW5 throughout the time period t3', the switch SW5 is kept in the on state throughout the time period t3'.

As a result, since the current mirror circuit CM2 generates a suppression current I5 throughout the time period t3' in response to the supply of the voltage Vcc from the power supply 3, the suppression current I5 is drawn from the driving current Idrive immediately after the occurrence of the overshoot, and the increase in the amount of the driving current Idrive is reduced.

As mentioned above, this embodiment 8 offers an advantage of being able to bring the waveform of the driving current Idrive at the time of the rise and fall of the driving current Idrive close to a rectangular one without disposing any waveform shaping circuit, like above-mentioned embodiment 1.

Embodiment 9

Figure 19:
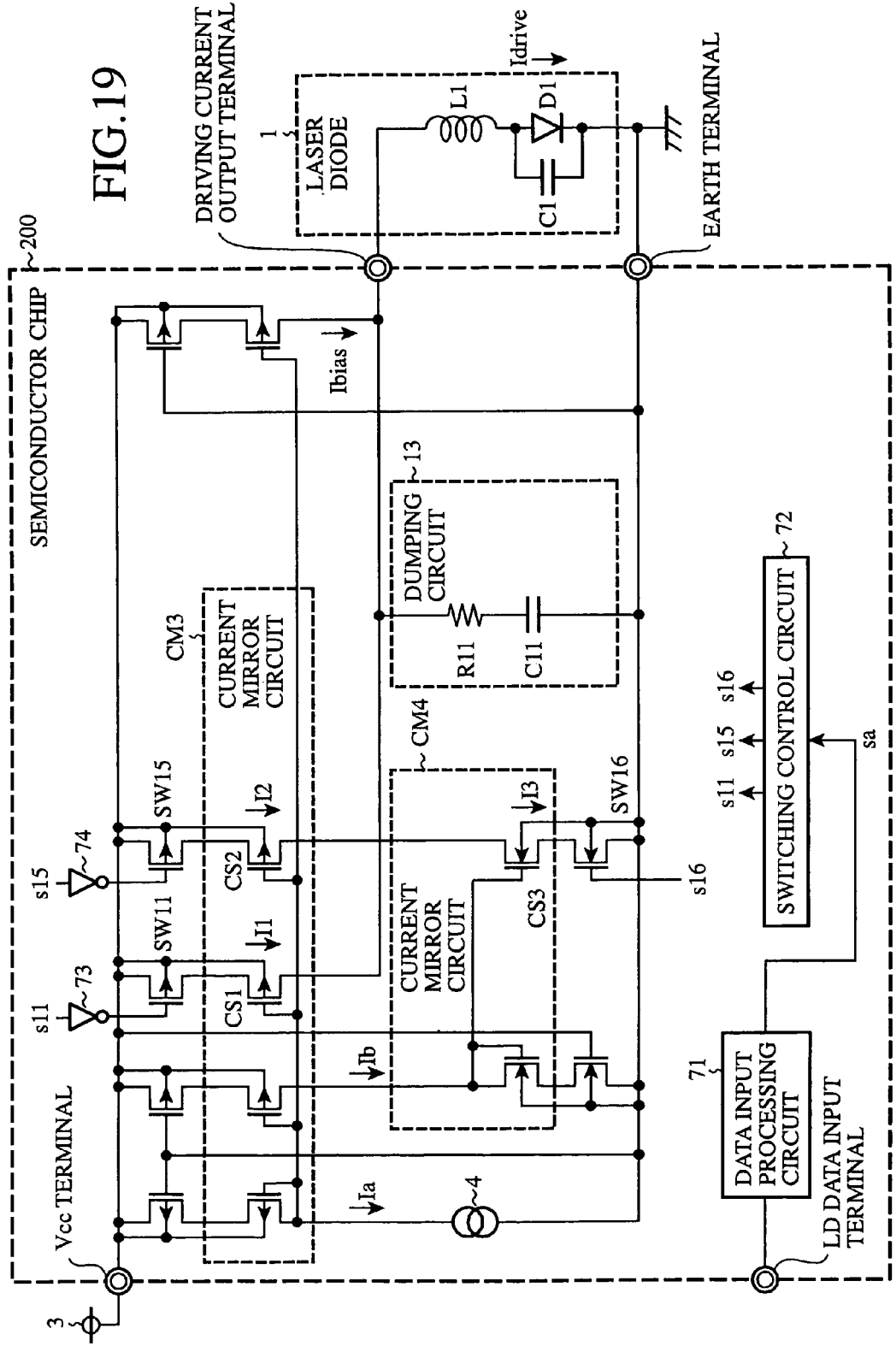
FIG. 19 is a detailed circuit diagram showing a driving circuit for driving a laser diode in accordance with embodiment 9 of the present invention.

FIG. 19 is a detailed circuit diagram showing a driving circuit for driving a laser diode in accordance with embodiment 9 of the present invention. In other words, FIG. 19 is a detailed circuit diagram corresponding to the block diagram of FIG. 9. In the example of FIG. 19, a circuit corresponding to the driving current supply circuit 11, charging circuit 14, discharging circuit 15, and dumping circuit 13 of the driving circuit of FIG. 9 are mounted in a semiconductor chip 200. As an alternative, the dumping circuit 13 can be disposed outside the semiconductor chip 200 such that it can be adjusted. The dumping circuit 13 can be alternatively disposed inside and outside the semiconductor chip 200 such that it can be adjusted.

A current mirror circuit CM3 is equipped with circuits corresponding to the current sources CS1 and CS2 respectively included in the driving current supply circuit 11 and charging circuit 14 of the driving circuit. The current mirror circuit CM3 is constructed so that a transistor is connected in series between the source of a transistor, which is placed on a side of connection with the diode, and a voltage Vcc, in order to compensate for a potential difference caused by the on resistance of each of switches SW11 and SW15.

A current mirror circuit CM4 corresponds to the current source CS3 included in the discharging circuit 15. The current mirror circuit CM4 is constructed so that a transistor is connected in series between the source of a transistor, which is placed on a side of connection with the diode, and a ground, in order to compensate for a potential difference caused by the on resistance of a switch SW16.

The switches SW11 and SW15 are PMOS transistors connected between the source of the current mirror circuit CM3 and the voltage Vcc, and switching between the on and off states of each of these switches is controlled by a switching control circuit 72. The switch SW16 is an NMOS transistor connected between the source of the current mirror circuit CM4 and the ground, and switching between the on and off states of the switch is controlled by the switching control circuit 72.

A data input processing circuit 71 carries out a process of generating a control signal sa used for controlling the light emitting of the laser diode 1. A switching control circuit 72 carries out a process of generating control signals s11, s15, and s16 used for switching between the on and off states of the switches SW11, SW15, and SW16 according to the control signal sa generated by the data input processing circuit 71. An inverter 73 inverts the logic of the control signal s11 generated by the switching control circuit 72, and carries out a process of outputting the inverted control signal s11 to the switch SW11. An inverter 74 inverts the logic of the control signal s15 generated by the switching control circuit 72, and carries out a process of outputting the inverted control signal s15 to the switch SW15.

Figure 20:
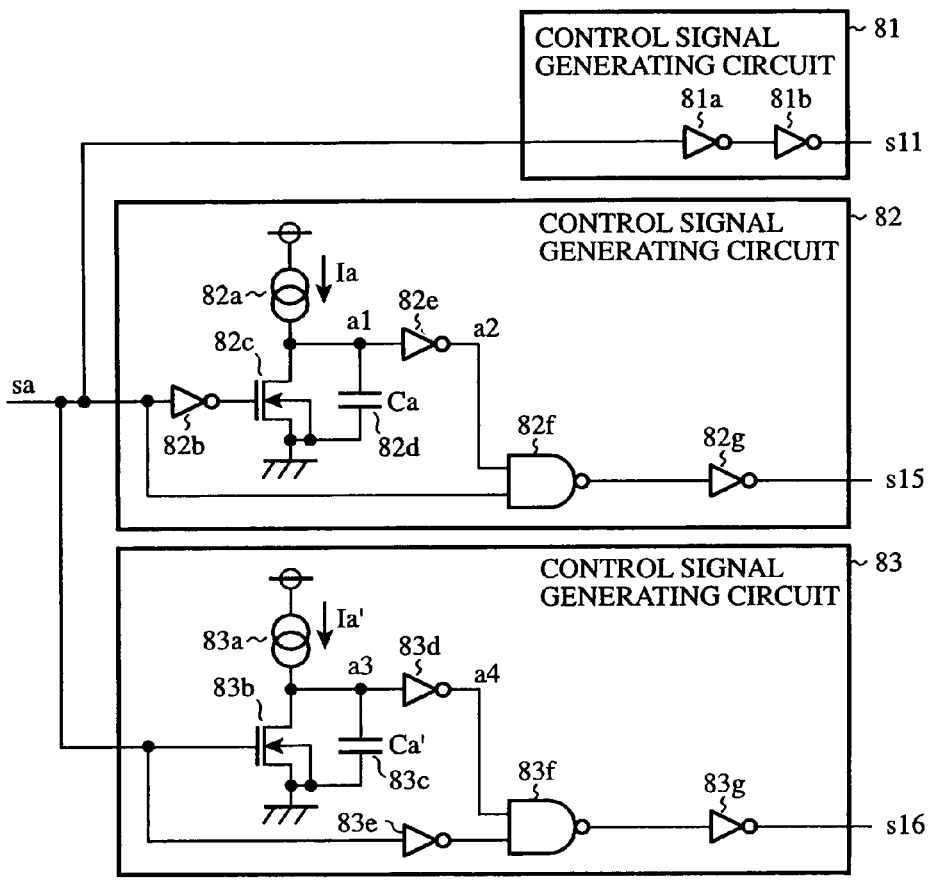
FIG. 20 is a detailed circuit diagram showing the internal structure of a switching control circuit of FIG. 19.

FIG. 20 is a detailed circuit diagram showing the internal structure of the switching control circuit 72 of FIG. 19. In the figure, a control signal generating circuit 81 generates a control signal s11 used for controlling the switch SW11 from the control signal sa generated by the data input processing circuit 71, and is provided with an inverter 81a for inverting the logic of the control signal sa generated by the data input processing circuit 71, and an inverter 81b for inverting the logic of the control signal sa outputted from the inverter 81a, and for outputting the inverted control signal sa, as the control signal s11, to the inverter 73. The control signal s11 outputted from the inverter 81b is substantially the same as the control signal sa generated by the data input processing circuit 71. Therefore, the inverters 81a and 81b can be removed from the control signal generating circuit 81.

Figure 21:
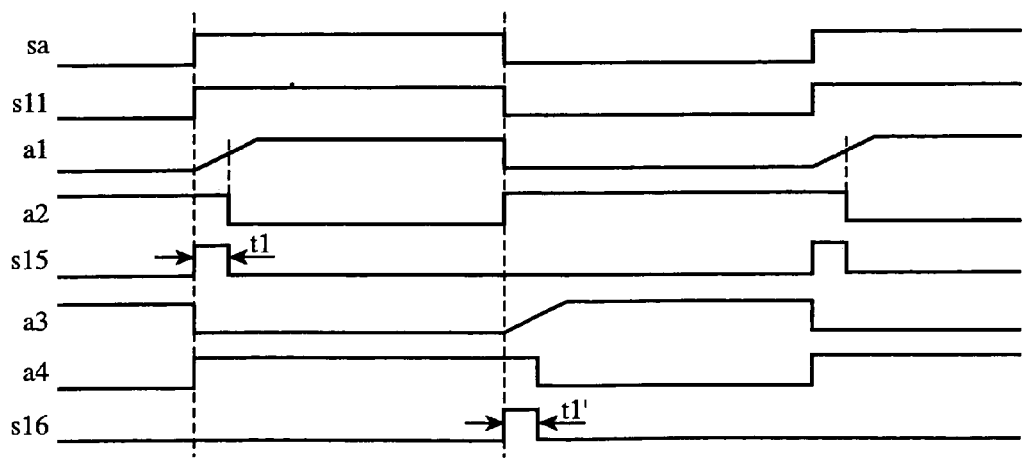
FIG. 21 is a timing chart of the switching control circuit of FIG. 19.

A control signal generating circuit 82 generates a control signal s15 used for controlling the switch SW15 from the control signal sa generated by the data input processing circuit 71, and is provided with a current source 82a, inverters 82b, 82e, and 82g, a transistor 82c, a capacitor 82d, and a NAND circuit 82f. A control signal generating circuit 83 generates a control signal s16 used for controlling the switch SW16 from the control signal sa generated by the data input processing circuit 71, and is provided with a current source 83a, a transistor 83b, a capacitor 83c, inverters 83d, 83e, and 83g, and a NAND circuit 83f. FIG. 21 is a timing chart showing the operation of the switching control circuit 72 of FIG. 19.

Next, the operation of the driving circuit in accordance with this embodiment of the present invention will be explained. The driving circuit in accordance with this embodiment basically operates in the same way that that of above-mentioned embodiment 4 does. In the example of FIG. 19, while the driving circuit in accordance with this embodiment is equipped with the data inputting processing circuit 71 and the switching control circuit 72, the switching control circuit 72 corresponds to the switching control circuit CNT1 of FIG. 9.

The data input processing circuit 71 generates a control signal sa having a High level and then outputs it to the switching control circuit 72 when causing the laser diode 1 to emit light, whereas it generates a control signal sa having a Low level and then outputs it to the switching control circuit 72 when not causing the laser diode 1 to emit light, as shown in FIG. 21. For simplicity's sake, assume that the data input processing circuit 71 generates a control signal sa having a High level and then outputs it to the switching control circuit 72.

In response to the control signal sa generated by the data input processing circuit 71, the switching control circuit 72 generates control signals s11, s15, and s16 used for controlling the on and off states of the switches SW11, SW15, and SW16 according to the control signal sa. In other words, the control signal generating circuit 81 of the switching control circuit 72 outputs a control signal s11, which is substantially the same as the control signal sa, to the inverter 73 in response to the control signal sa having a High level from the data input processing circuit 71. Since the control signal s11 having a High level outputted from the control signal generating circuit 71 of the switching control circuit 72 is inverted by the inverter 73, and therefore the control signal s11 having a Low level is outputted to the switch SW11 throughout a time period during which the control signal sa generated by the data input processing circuit 71 is at a High level, the switch SW11 is switched on and is kept in the on state throughout the time period.

As a result, although the current mirror circuit CM3 outputs a current in response to the supply of the voltage Vcc from the power supply 3, the current outputted from the current mirror circuit CM3 is divided into both a driving current Idrive (referred to as the current pulse ILD in above-mentioned embodiment 4) which flows into the laser diode 1, and a current which flows into the capacitor C11 of the dumping circuit 13. Although the potential of the anode of the laser diode 1 is decided by the amount of the driving current Idrive, as previously mentioned in embodiment 4, the latter current keeps flowing into the capacitor C11 until the potential V1 (i.e., the terminal voltage V1 of capacitor C11) of a connection point between the resistance element R11 and the capacitor C11 becomes equal to the potential of the anode of the laser diode 1. Therefore, the rising time of the driving current Idrive which flows into the laser diode LD1 becomes longer than that in a case where the dumping circuit 13 is not connected in parallel to the laser diode LD1.

The control signal generating circuit 82 of the switching control circuit 72 generates a control signal s15 used for switching on the switch SW15 and keeping it in the on state throughout a time period t1 at the same time when the switch SW11 is switched on in order to shorten the rising time of the driving current Idrive which flows into the laser diode LD1, as shown in FIG. 21. The time period t1 is decided by the capacitance Ca of the capacitor 82d and a reference current Ia in the control signal generating circuit 82. Since the control signal s15 having a High level outputted from the control signal generating circuit 82 of the switching control circuit 72 is inverted by the inverter 74 and therefore the control signal s15 having a Low level is outputted to the switch SW15 throughout the time period t1, the switch SW15 is kept in the on state throughout the time period t1.

As a result, since the current mirror circuit CM3 generates a charging current I2, as well as the driving current Idrive, throughout the time period t1, in response to the supply of the voltage Vcc from the power supply 3, the charging current I2 is supplied to the capacitor C11 of the dumping circuit 13. For this reason, the terminal voltage V1 of the capacitor C11 quickly becomes equal to the potential of the anode of the laser diode 1. As a result, the rising time of the driving current Idrive supplied to the laser diode 1 is shortened.

After that, when the time period t1 elapses, the control signal s15 having a Low level is outputted from the control signal generating circuit 82 of the switching control circuit 72, as shown in FIG. 21. Since the control signal s15 having a Low level is inverted by the inverter 74 and therefore the control signal s15 having a High level is outputted to the switch SW15, the switch SW15 is switched off after the time period t1 has elapsed.

As a result, since the current mirror circuit CM3 stops the generation of the charging current I2, the driving current Idrive outputted from the current mirror circuit CM3 flows into the capacitor C11 of the dumping circuit 13 again, and therefore the capacitor C11 becomes charged. Therefore, the change in the waveform of the driving current Idrive which flows into the laser diode is gentled. Thus, when the resistance of the resistance element R11 and the capacitance of the capacitor C11 of the dumping circuit 13 are adjusted to appropriate values, respectively, ringing which appears after the rise of the driving current Idrive which flows into the laser diode 1 can be suppressed.

Next, switching from the on state to the off state of the laser diode 1 will be explained. In this case, the data input processing circuit 71 generates a control signal sa having a Low level, and outputs it to the switching control circuit 72. When the control signal sa outputted from the data input processing circuit 71 makes a transition from a High level to a Low level, the control signal generating circuit 81 of the switching control circuit 72 outputs a control signal s11 having a Low level to the inverter 73. Since the control signal s11 having a Low level outputted from the control signal generating circuit 81 of the switching control circuit 72 is inverted by the inverter 73 and therefore the control signal s11 having a High level is outputted to the switch SW11 throughout a time period during which the control signal sa generated by the data input processing circuit 71 is at a Low level, the switch SW11 is switched off and is kept in the off state throughout the time period.

As a result, since the current mirror circuit CM3 stops the generation of the light emitting current I1, the driving current Idrive supplied to the laser diode 1 falls, and, finally, only the bias current Ibias remains as the current supplied to the laser diode.

The control signal generating circuit 83 of the switching control circuit 72 generates a control signal s16 used for switching on the switch SW16 and keeping it in the on state throughout a time period t1' at the same time when the switch SW11 is switched off in order to shorten the falling time of the driving current Idrive which flows into the laser diode 1, as shown in FIG. 21. The time period t1' is decided by the capacitance Ca' of the capacitor 83c and a reference current Ia' in the control signal generating circuit 83. Since the control signal s16 outputted from the control signal generating circuit 83 of the switching control circuit 72 is outputted to the switch SW16 throughout the time period t1', the switch SW16 is kept in the on state throughout the time period t1'.

As a result, since the current mirror circuit CM4 generates a drawn current I3 throughout a time period t1' in response to the supply of the voltage Vcc from the power supply 3, the drawn current I3 is drawn from the driving current Idrive supplied to the laser diode 1, and the fall of the driving current Idrive becomes steep.

After that, when the time period t1' elapses, the control signal s16 having a Low level is outputted from the control signal generating circuit 83 of the switching control circuit 72, as shown in FIG. 21. When the time period t1' elapses, the control signal s15 having a Low level is outputted to the switch SW16 and therefore the switch SW16 is switched off.

As a result, since the current mirror circuit CM4 stops the generation of the drawn current I3, and therefore the driving current Idrive which flows into the laser diode 1 varies at a time constant decided by resistance components, capacity components, and inductance components which the resistance element R11, the capacitor C11, and the laser diode LD1 etc. have, ringing can be suppressed in a state in which the resistance of the resistance element R11 and the capacitance of the capacitor C11 have been adjusted to appropriate values, respectively.

As can be seen from the above description, this embodiment 9 offers an advantage of being able to reduce an overshoot and an undershoot which occur in the waveform of output light, and to shorten the rising time and falling time of the waveform of the output light, like above-mentioned embodiment 4. In addition, the driving circuit includes the switching control circuit 72 for setting the closing time periods during which the switches SW15 and SW16 are closed, respectively, (i.e., the widths of pulses for closing the switches, respectively) and the amounts (i.e., the amplitudes) of the currents respectively outputted from the current source CS2 and CS3 to arbitrary values, respectively. Therefore, even when the laser diode LD1 has a different parasitic element component, the driving circuit can respond flexibly to the change in the parasitic element component of the laser diode.

Embodiment 10

FIG. 22 is a detailed circuit diagram showing a driving circuit for driving a laser diode in accordance with embodiment 10 of the present invention. In the figure, since the same reference numerals as shown in FIG. 16 denote the same components as those of FIG. 16 or like components, the explanation of these components will be omitted hereafter. A dumping circuit 91 is connected in parallel to the laser diode 1 in order to reduce an overshoot and an undershoot which occur at the time of the rise and fall of a driving current Idrive which is supplied to the laser diode 1. The dumping circuit 91 is provided with a series circuit comprised of a resistance element R11, a capacitor (i.e., a capacitive element) C11, and a switch SW12, a series circuit comprised of a resistance element R12, a capacitor (i.e., a capacitive element) C12, and a switch SW13, a series circuit comprised of a resistance element R13, a capacitor (i.e., a capacitive element) C13, and a switch SW14.

A control data input circuit 92 serially accepts three pieces of setting information s6, s7, and s8 via a control data input terminal in synchronization with, for example, a serial clock, and outputs the pieces of setting information s6, s7, and s8 to a dumping circuit setting circuit 93. As an alternative, the control data input circuit 92 accepts the pieces of setting information s6, s7, and s8 via external terminals in parallel, and outputs the pieces of setting information s6, s7, and s8 to the dumping circuit setting circuit 93. The dumping circuit setting circuit 93 includes switch setting information holding circuits 93a, 93b, and 93c, such as registers, for respectively holding the pieces of setting information s6, s7, and s8, and carries out a process of outputting the pieces of setting information s6, s7, and s8 outputted from the control data input circuit 92 to the switches SW12, SW13, and SW14 of the dumping circuit 91, respectively., The driving circuit in accordance with this embodiment 10 differs with that in accordance with above-mentioned embodiment 8 shown in FIG. 16 in that the dumping circuit 91 equipped with the switches is disposed instead of the dumping circuit 2 of FIG. 16, and the control data input circuit 92 and the dumping circuit setting circuit 93 are added to the semiconductor chip 100. The difference between this embodiment and above-mentioned embodiment 8 will be explained hereafter.

The control data input circuit 92 serially accepts three pieces of setting information s6, s7, and s8 via the control data input terminal in synchronization with, for example, a serial clock, and outputs the pieces of setting information s6, s7, and s8 to the dumping circuit setting circuit 93. As an alternative, when external terminals corresponding to the three pieces of setting information s6, s7, and s8 are disposed in the semiconductor chip 100, the control data input circuit 92 accepts the pieces of setting information s6, s7, and s8 via the external terminals in parallel, and outputs the pieces of setting information s6, s7, and s8 to the dumping circuit setting circuit 93.

When receiving the three pieces of setting information s6, s7, and s8 from the control data input circuit 92, the dumping circuit setting circuit 93 stores them in the switch setting information holding circuits 93a, 93b, and 93c, respectively. The dumping circuit setting circuit 93 also controls switching of the on and off states of the switches SW12, SW13, and SW14 by outputting the three pieces of setting information s6, s7, and s8 to the switches SW12, SW13, and SW14 of the dumping circuit 91, respectively.

In the dumping circuit 91, when one of the switches SW12, SW13, and SW14 is switched on by the dumping circuit setting circuit 93, the corresponding series circuit in which the one of the switches SW12, SW13, and SW14 is contained is enabled. For example, when the switch SW12 is switched on and the other switches SW13 and SW14 are switched off, only the series circuit in which the switch SW12 is contained is enabled. On the other hand, when the switches SW12 and SW13 are switched on and the other switch SW14 is switched off, only the series circuits in which the switches SW12 and SW13 are respectively contained are enabled. Therefore, the time constant of the dumping circuit 91 can be suitably set according to the three pieces of setting information s6, s7, and s8.

As can be seen from the above description, this embodiment 10 offers an advantage of being able to, when switching among laser diodes LD1 having different characteristics, sufficiently reduce an overshoot and an undershoot which occur in the waveform of output light for each of the laser diodes LD1 since it is possible to set the time constant of the dumping circuit 91 to an appropriate value for each of the laser diodes LD1 so as to carry out fine tuning of the waveform of the output light by properly controlling opening and closing of each of the switches SW12, SW13, and SW14, like above-mentioned embodiment 3, in addition to the same advantage as provided by above-mentioned embodiment 8.

Furthermore, in a case where the driving circuit for driving the laser diode in which the total capacitance of the dumping circuit 91 can be varied is built in an optical pickup integrated circuit, when laser diodes having different electrical characteristics are connected to the driving circuit and one of them is selectively used, since the total capacitance of the dumping circuit 91 can be set to a value suitable for the characteristics of the laser diode currently being used, this embodiment makes it possible to facilitate the fine tuning of the waveform of the output light at the time of manufacturing the optical pickup integrated circuit.

Many widely different embodiments of the present invention may be constructed without departing from the spirit and scope of the present invention. It should be understood that the present invention is not limited to the specific embodiments described in the specification, except as defined in the appended claims.

What is claimed is:

1. A driving circuit for driving a laser diode, said driving circuit comprising:
   a driving current supply circuit for supplying a driving current to said laser diode when causing said laser diode to emit light;
   an auxiliary current supply circuit for, when the driving current supplied from said driving current supply circuit rises, supplying an auxiliary current for speeding up the rise of the driving current to said laser diode; and
   a suppression current supply circuit for supplying a suppression current for reducing a decrease in the driving current, which occurs after occurrence of an overshoot at the time of the rise of the driving current supplied from said driving current supply circuit, to said laser diode.

2. A driving circuit for driving a laser diode, said driving circuit comprising:
   a driving current supply circuit for supplying a driving current to said laser diode when causing said laser diode to emit light;
   a current drawing circuit for drawing a current from the driving current when the driving current supplied from said driving current supply circuit falls; and
   an increase control circuit for drawing a suppression current, which reduces an increase in the driving current which occurs after occurrence of an undershoot at the time of the fall of the driving current supplied from said driving current supply circuit, from the driving current.

3. A driving circuit for driving a laser diode, said driving circuit comprising:
   a driving current supply circuit for supplying a driving current to said laser diode when causing said laser diode to emit light;
   an auxiliary current supply circuit for, when the driving current supplied from said driving current supply circuit rises, supplying an auxiliary current for speeding up the rise of the driving current to said laser diode;

a suppression current supply circuit for supplying a suppression current for reducing a decrease in the driving current, which occurs after occurrence of an overshoot at the time of the rise of the driving current supplied from said driving current supply circuit, to said laser diode;

a current drawing circuit for drawing a current from the driving current when the driving current supplied from said driving current supply circuit falls; and an increase control circuit for drawing a suppression current, which reduces an increase in the driving current which occurs after occurrence of an undershoot at the time of the fall of the driving current supplied from said driving current supply circuit, from the driving current.

4. A driving circuit for driving a laser diode, said driving circuit including a driving current supply circuit for supplying a driving current to said laser diode when causing said laser diode to emit light, and a dumping circuit connected in parallel to said laser diode, for suppressing both an overshoot which occurs at a time of a rise of the driving current supplied from said driving current supply circuit to said laser diode, and an undershoot which occurs at a time of a fall of the driving current, wherein said dumping circuit includes a resistance element and a capacitive element which are connected in series, and said capacitive element includes two or more series circuits connected in parallel, each of said two or more series circuits having a capacitor and a switch connected in series.

5. A driving circuit for driving a laser diode, said driving circuit including a driving current supply circuit for supplying a driving current to said laser diode when causing said laser diode to emit light, and a dumping circuit connected in parallel to said laser diode, for suppressing both an overshoot which occurs at a time of a rise of the driving current supplied from said driving current supply circuit to said laser diode, and an undershoot which occurs at a time of a fall of the driving current, said driving circuit comprising:

charging means for putting an electric charge into a capacitive element which constitutes said dumping circuit throughout a predetermined time period immediately after said driving current supply circuit starts supplying the driving current to said laser diode; and discharging means for drawing the electric charge put into said capacitive element throughout a predetermined time period immediately after said driving current supply circuit stops the supply of the driving current to said laser diode.

6. The driving circuit according to claim 5, further comprising driving means for supplying a current to said laser diode throughout the predetermined time period immediately after said driving current supply circuit starts supplying the driving current to said laser diode, and for drawing a current flowing into said laser diode throughout the predetermined time period immediately after said driving current supply circuit stops the supply of the driving current to said laser diode.

7. The driving circuit according to claim 5, wherein at least one of said charging means and said discharging means is provided with a function of adjusting a pulse width and an amplitude value of a current.

8. The driving circuit according to claim 6, wherein at least one of said charging means and said discharging means is provided with a function of adjusting a pulse width and an amplitude value of a current.

9. The driving circuit according to claim 1, further comprising a dumping circuit connected in parallel to said laser diode, for suppressing both an overshoot which occurs at a time of a rise of the driving current supplied from said driving current supply circuit to said laser diode, and an undershoot which occurs at a time of a fall of the driving current, and said dumping circuit includes a resistance element and a capacitive element which are connected in series, and said capacitive element includes two or more series circuits connected in parallel, each of said two or more series circuits having a capacitor and a switch connected in series.

10. The driving circuit according to claim 2, further comprising a dumping circuit connected in parallel to said laser diode, for suppressing both an overshoot which occurs at a time of a rise of the driving current supplied from said driving current supply circuit to said laser diode, and an undershoot which occurs at a time of a fall of the driving current, and said dumping circuit includes a resistance element and a capacitive element which are connected in series, and said capacitive element includes two or more series circuits connected in parallel, each of said two or more series circuits having a capacitor and a switch connected in series.

11. The driving circuit according to claim 3, further comprising a dumping circuit connected in parallel to said laser diode, for suppressing both an overshoot which occurs at a time of a rise of the driving current supplied from said driving current supply circuit to said laser diode, and an undershoot which occurs at a time of a fall of the driving current, and said dumping circuit includes a resistance element and a capacitive element which are connected in series, and said capacitive element includes two or more series circuits connected in parallel, each of said two or more series circuits having a capacitor and a switch connected in series.

12. A semiconductor device that causes a light emitting element to emit light by sending a current having an amount larger than a first amount to said light emitting element, said semiconductor device comprising:

an output terminal connected to said light emitting element;

a current generating circuit having a first node connected to said output terminal, and a first switch that receives a first control signal, in which, when said first control signal has a first logic level, a current having an amount equal to or larger than said first amount flows into said first node, and, when said first control signal has a second logic level, said first switch is brought into conduction and a current having a second amount which exceeds said first amount flows into said first node;

an auxiliary current generating circuit having a second node connected to said output terminal, and a second switch which receives a second control signal, in which, after said first control signal makes a transition from the first logic level to the second logic level, said second switch is brought into conduction and a current having a third amount flows into said second node throughout a first time period; and a suppression current generating circuit having a third node connected to said output terminal, and a third switch which receives a third control signal, in which, after said second switch is brought into conduction and a second time period elapses, said third switch is brought into conduction and a current having a fourth amount flows into said third node throughout a third time period.

13. A semiconductor device that causes a light emitting element to emit light by sending a current having an amount larger than a first amount to said light emitting element, said semiconductor device comprising:
   an output terminal connected to said light emitting element;
   a current generating circuit having a first node connected to said output terminal, and a first switch that receives a first control signal, in which, when said first control signal has a first logic level, a current having an amount equal to or smaller than said first amount flows into said first node, and, when said first control signal has a second logic level, said first switch is brought into conduction and a current having a second amount which exceeds said first amount flows into said first node;
   a current drawing circuit having a fourth node connected to said output terminal, and a fourth switch that receives a fourth control signal, in which, after said first control signal makes a transition from the second logic level to the first logic level, said fourth switch is brought into conduction and a current having a fifth amount flows into said fourth node throughout a fourth time period; and
   a increase control circuit having a fifth node connected to said output terminal, and a fifth switch which receives a fifth control signal, in which, after said fourth switch is brought into conduction and a fifth time period elapses, said fifth switch is brought into conduction and a current having a sixth amount flows into said fifth node throughout a sixth time period.

14. A semiconductor device that drives a light emitting element, said semiconductor device comprising:
   an output terminal connected to said light emitting element;
   a current generating circuit having a first node connected to said output terminal, and a first switch that receives a first control signal, in which, when said first control signal has a first logic level, a current having a first amount flows into said first node and, when said first control signal becomes a second logic level, said first switch is brought into conduction and a current having a second amount which exceeds said first amount flows into said first node;
   an auxiliary current generating circuit having a second node connected to said output terminal, and a second switch which receives a second control signal, in which, after said first control signal makes a transition from the first logic level to the second logic level, said second switch is brought into conduction and a current having a third amount flows into said second node throughout a first time period; and
   a suppression current generating circuit having a third node connected to said output terminal, and a third switch which receives a third control signal, in which, after said second switch is brought into conduction and a second time period elapses, said third switch is brought into conduction and a current having a fourth amount flows into said third node throughout a third time period.

15. A semiconductor device that drives a light emitting element, said semiconductor device comprising:
   an output terminal connected to said light emitting element;
   a current generating circuit having a first node connected to said output terminal, and a first switch that receives a first control signal, in which, when said first control signal has a first logic level, a current having a first amount flows into said first node, and, when said first control signal becomes a second logic level, said first switch is brought into conduction and a current having a second amount which exceeds said first amount flows into said first node;
   a current drawing circuit having a fourth node connected to said output terminal, and a fourth switch that receives a fourth control signal, in which, after said first control signal makes a transition from the second logic level to the first logic level, said fourth switch is brought into conduction and a current having a fifth amount flows into said fourth node throughout a fourth time period; and
   an increase control circuit having a fifth node connected to said output terminal, and a fifth switch which receives a fifth control signal, in which, after said fourth switch is brought into conduction and a fifth time period elapses, said fifth switch is brought into conduction and a current having a sixth amount flows into said fifth node throughout a sixth time period.

16. The semiconductor device according to claim 12, further comprising:
   a dumping circuit connected to said output terminal and provided with a resistor and a capacitor connected in series
   a switch connected between said dumping circuit and a ground terminal; and
   a dumping circuit setting circuit for switching conduction and non-conduction states of said switch according to switch setting information.

17. The semiconductor device according to claim 13, further comprising:
   a dumping circuit connected to said output terminal and provided with a resistor and a capacitor connected in series;
   a switch connected between said dumping circuit and a ground terminal; and
   a dumping circuit setting circuit for switching conduction and non-conduction states of said switch according to switch setting information.

18. The semiconductor device according to claim 14, further comprising:
   a dumping circuit connected to said output terminal and provided with a resistor and a capacitor connected in series;
   a switch connected between said dumping circuit and a around terminal; and
   a dumping circuit setting circuit for switching conduction and non-conduction states of said switch according to switch setting information.

19. The semiconductor device according to claim 15, further comprising:
   a dumping circuit connected to said output terminal and provided with a resistor and a capacitor connected in series
   a switch connected between said dumping circuit and a around terminal; and
   a dumping circuit setting circuit for switching conduction and non-conduction states of said switch according to switch setting information.

20. A semiconductor device that drives a light emitting element, said semiconductor device comprising:

an output terminal connected to said light emitting element;

a dumping circuit connected to said output terminal and provided with a resistor and a capacitor connected in series; a switch connected between said dumping circuit and a ground terminal; and a dumping circuit setting circuit for switching conduction and non-conduction states of said switch according to switch setting information.

21. An optical pickup comprising:

a laser diode; and a semiconductor device for driving said laser diode, wherein said semiconductor device comprises:

a control signal generating circuit generating a first control signal, a second control signal, and a third control signal for controlling the on and off state of a first current supply circuit, a second current supply circuit, and a third current supply circuit for supplying current for said laser diode respectively in response to a data signal, wherein said first control signal has a first predetermined period for supplying current for said laser diode, wherein said second control signal has a second predetermined period which is shorter than said first predetermined period of said first control signal starting after the first predetermined period starts, and wherein said third control signal has a third predetermined period which is shorter than said first predetermined period of said first control signal starting after the second predetermined period of said second control signals starts.

* * * * *